(12) United States Patent
Kunikiyo

(10) Patent No.: US 6,429,487 B1
(45) Date of Patent: Aug. 6, 2002

(54) SEMICONDUCTOR DEVICE HAVING GATE TO BODY CONNECTION

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/755,118

(22) Filed: Jan. 8, 2001

(30) Foreign Application Priority Data

Jul. 18, 2000 (JP) ........................................ 2000-217389

(51) Int. Cl.⁷ ..................... H01L 27/01; H01L 27/02; H01L 31/392
(52) U.S. Cl. ..................... 257/354; 257/347
(58) Field of Search ..................... 257/347, 409, 257/354

(56) References Cited

U.S. PATENT DOCUMENTS

| | | | | |
|---|---|---|---|---|
| 5,355,012 A | * | 10/1994 | Yamaguchi et al. | 257/409 |
| 5,559,368 A | | 9/1996 | Chenming et al. | 257/369 |
| 5,753,955 A | * | 5/1998 | Fechner | 257/347 |
| 6,005,794 A | | 12/1999 | Sheffield et al. | 365/154 |
| 6,011,726 A | | 1/2000 | Batson et al. | 365/188 |
| 6,252,280 B1 | * | 6/2001 | Hirano | 257/347 |
| 6,278,165 B1 | * | 8/2001 | Oowaki et al. | 257/410 |

OTHER PUBLICATIONS

Weiquan Zhang, et al. "High Responsivity Photo–Sensor Using Gate–Body Tied SOI MOSFET", Proceedings 1998 IEEE International SOI Conference, Oct. 1998, pp. 149–150.

* cited by examiner

Primary Examiner—David Nelms
Assistant Examiner—Tu-Tu Ho
(74) Attorney, Agent, or Firm—Oblon, Spivak, McClelland, Maier & Neustadt, P.C.

(57) ABSTRACT

In an isolation region of an SOI substrate (1), an STI (10) is formed in a silicon layer (4). In an end portion of the isolation region, a $p^+$-type impurity diffusion region (11) is selectively formed, being buried in part of an upper surface of the STI (10), in an upper surface of the silicon layer (4). In an element formation region of the SOI substrate (1), a body region (15) which is in contact with a side surface of the impurity diffusion region (11) is formed in the silicon layer (4). A tungsten plug (14) is in contact with the impurity diffusion region (11) with a barrier film (13) interposed therebetween, and in contact with part of an upper surface of a gate electrode (9) and a side surface thereof with the barrier film (13) interposed therebetween. With this structure obtained is a semiconductor device which makes it possible to avoid or suppress generation of an area penalty which is generated when a gate-body contact region is formed inside the silicon layer in an SOI-DTMOSFET.

18 Claims, 37 Drawing Sheets

F I G . 2
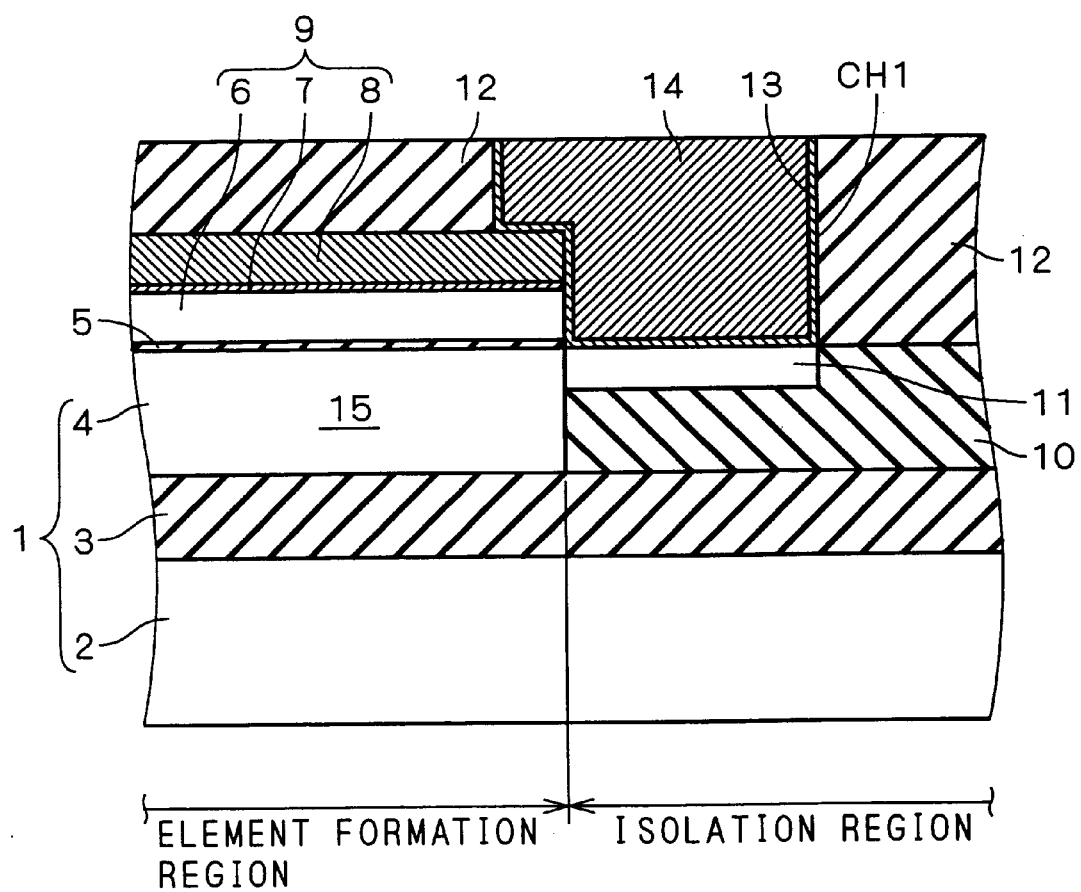

F I G. 3
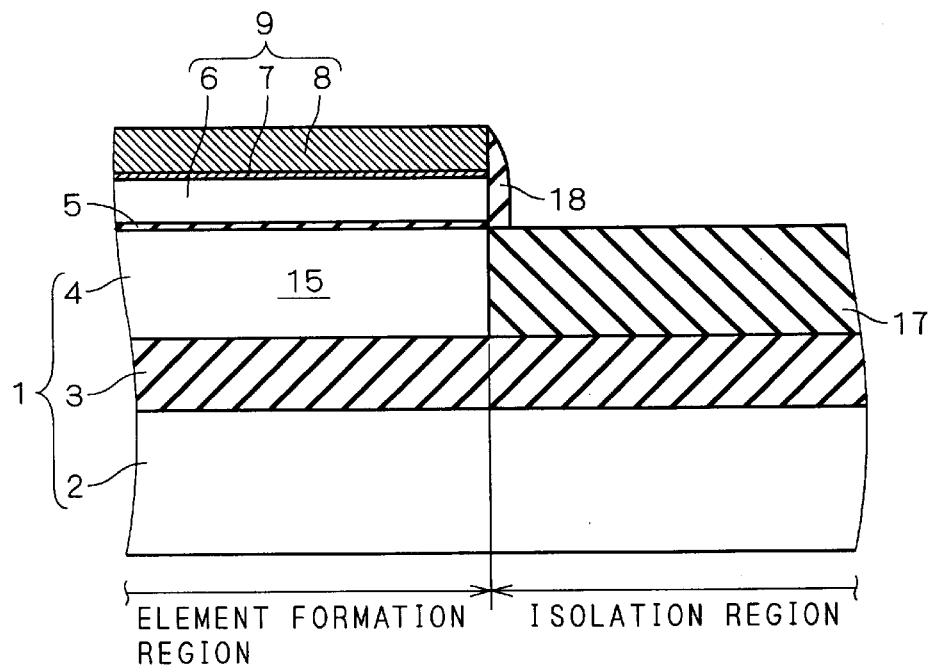
F I G. 4
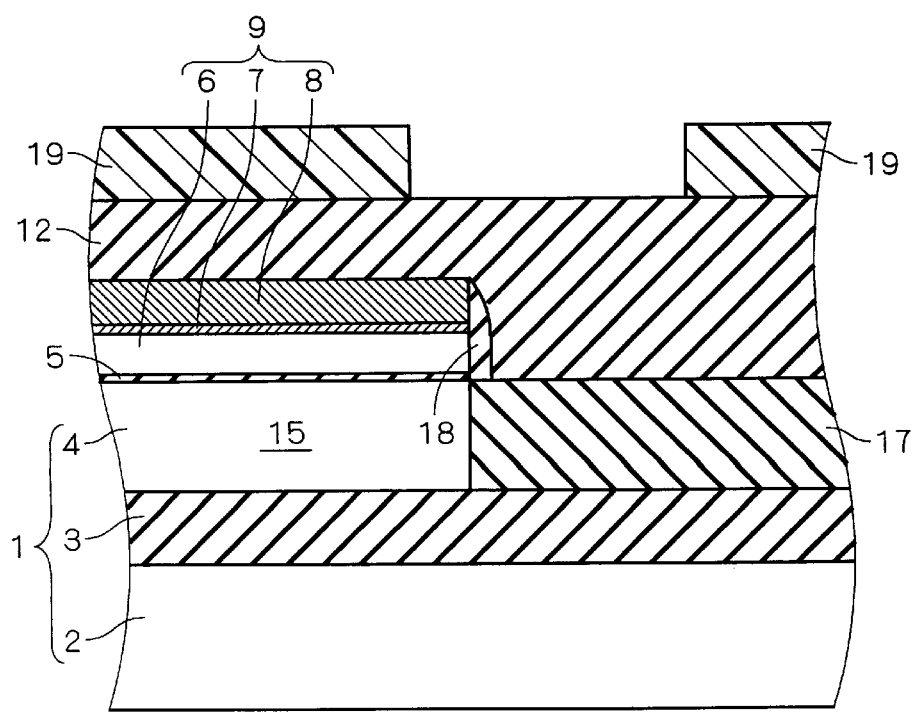

ELEMENT FORMATION REGION | ISOLATION REGION

F I G . 2 4
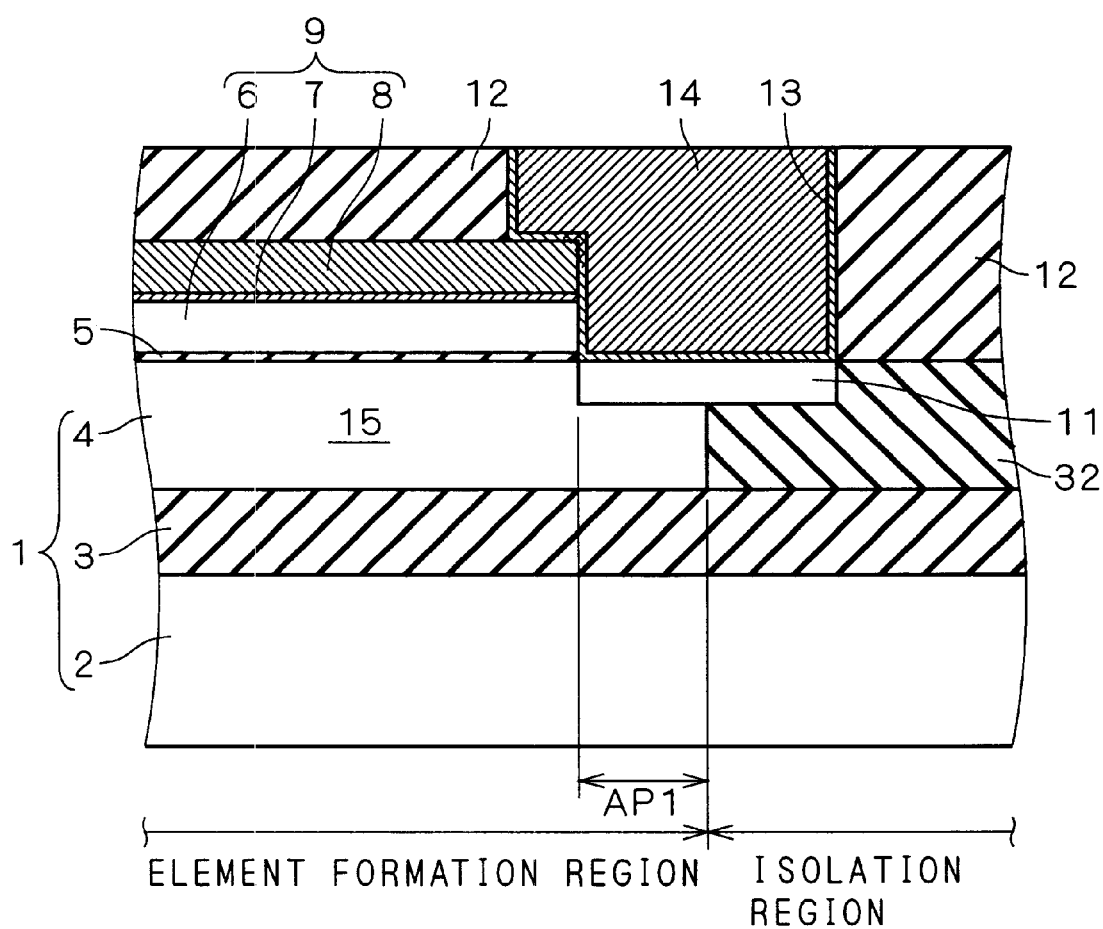
ELEMENT FORMATION REGION | ISOLATION REGION

ELEMENT FORMATION REGION | ISOLATION REGION

F I G . 3 2
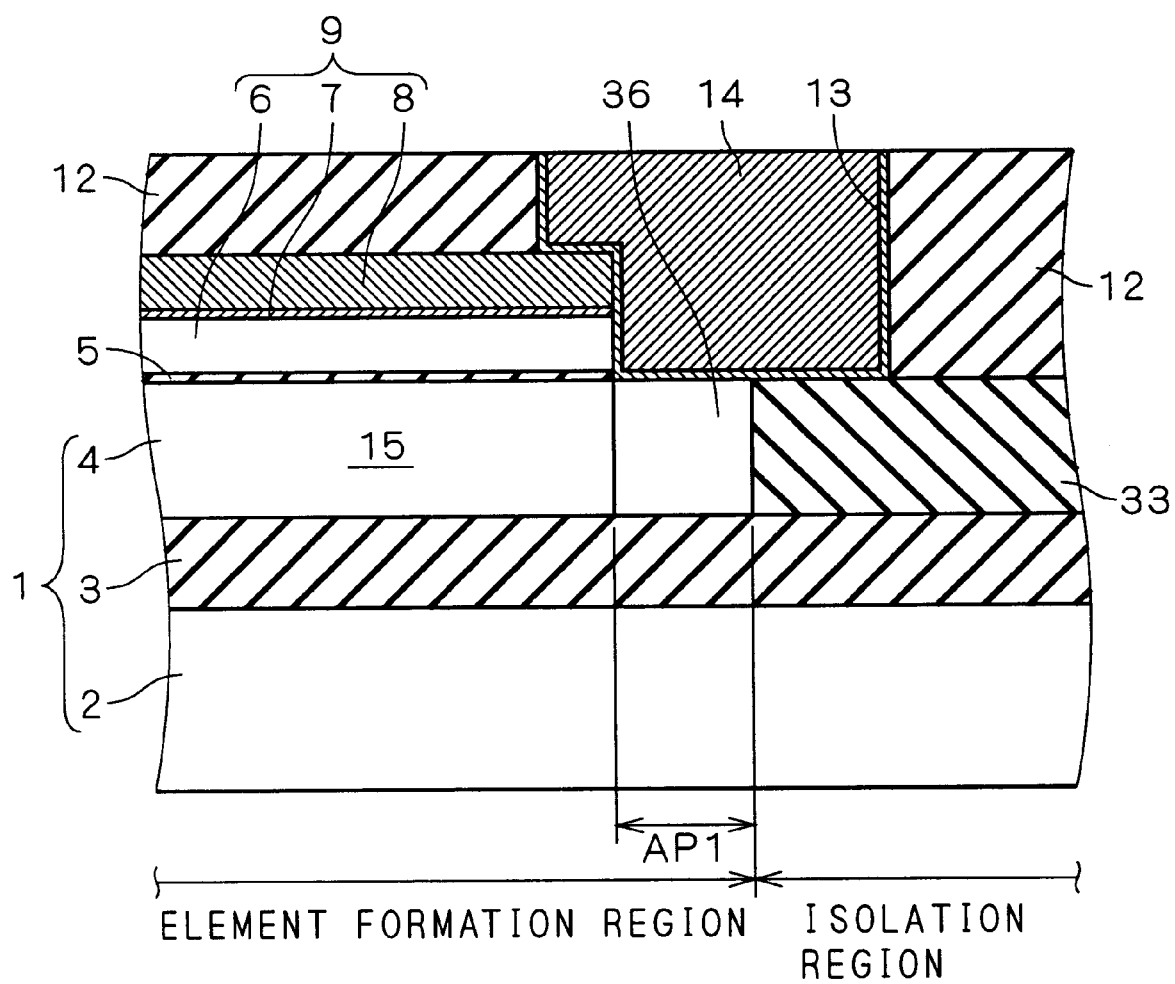

F I G . 3 3
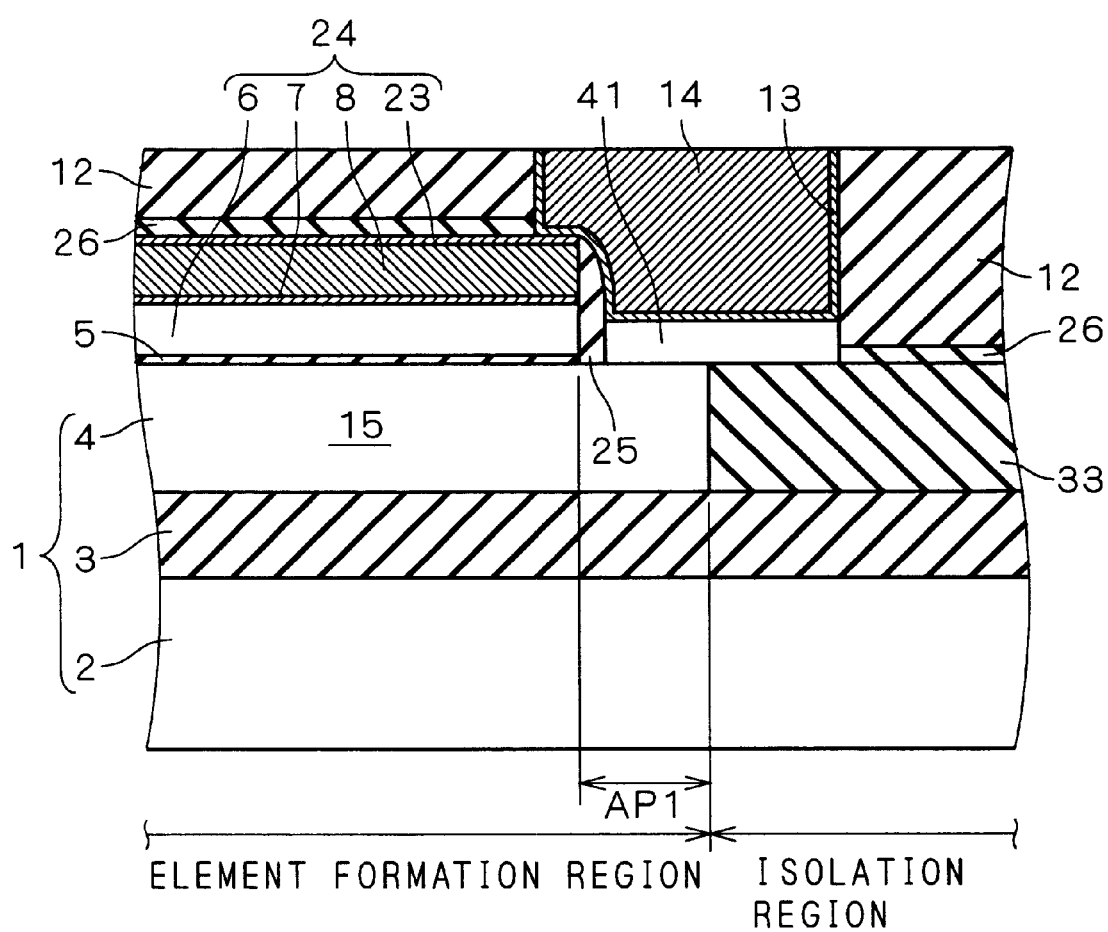

ELEMENT FORMATION REGION | ISOLATION REGION

F I G . 3 6
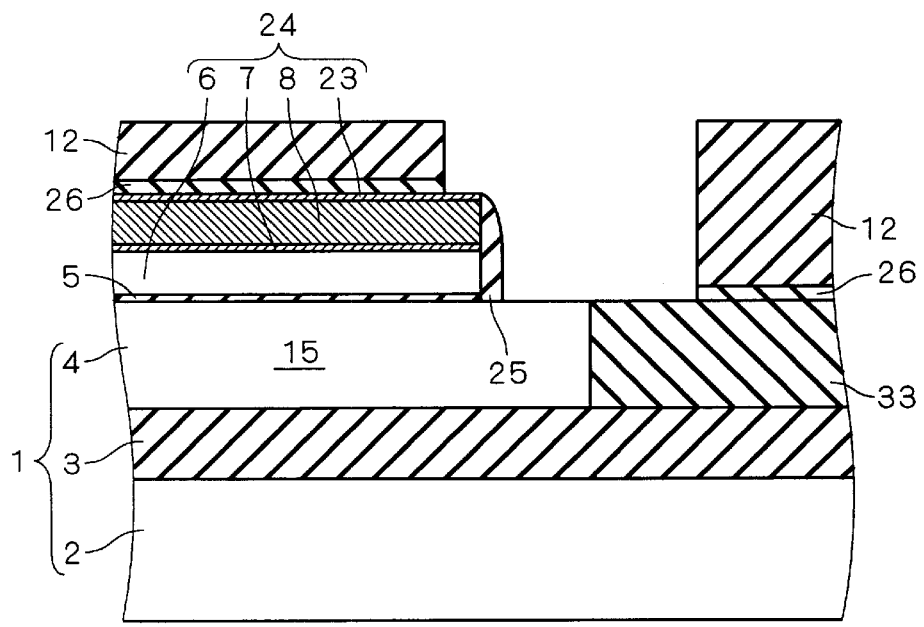
F I G . 3 7
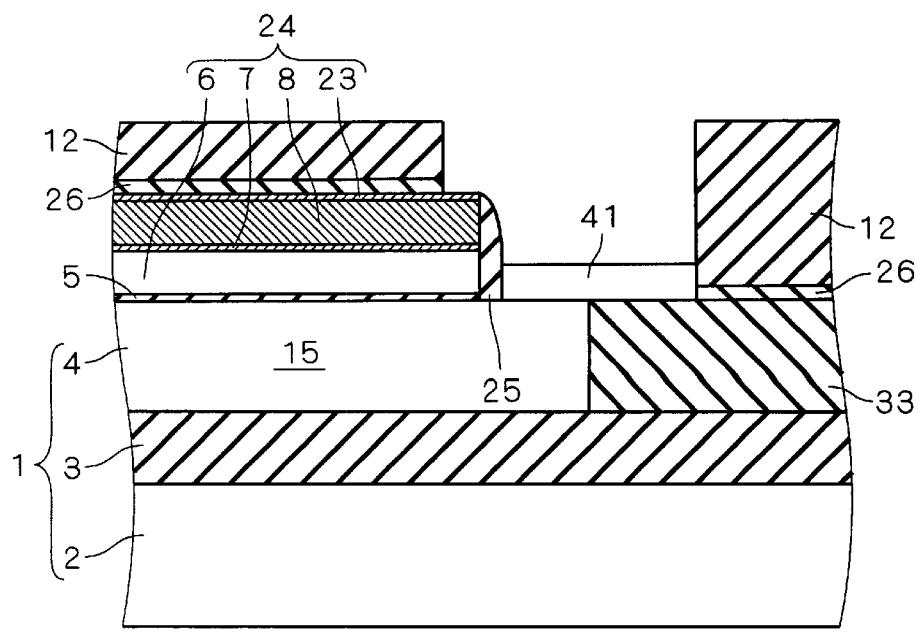

● ELECTRON
○ POSITIVE HOLE

F I G . 46
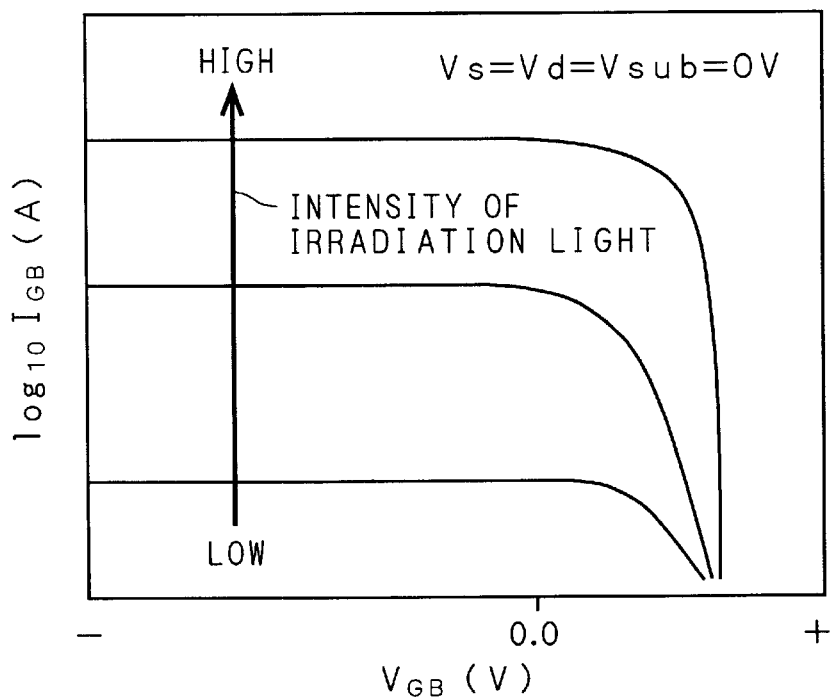
F I G . 47
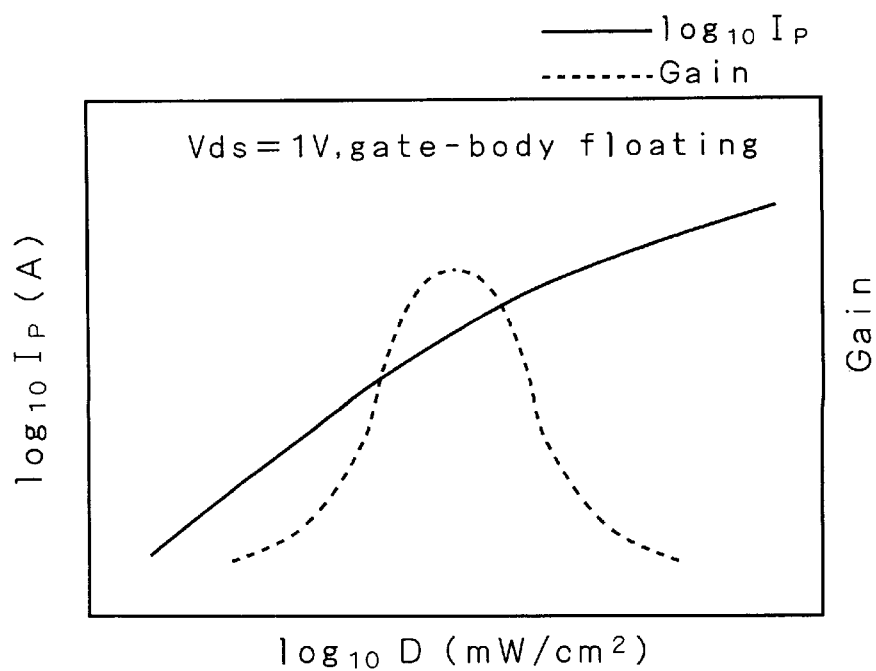

SEMICONDUCTOR DEVICE HAVING GATE TO BODY CONNECTION

BACKGROUND OF THE INVENTION

1. Field of the Invention

The present invention relates to a structure of a semiconductor device, and more particularly to a structure of a DTMOSFET (Dynamic Threshold Metal Oxide Silicon Field Effect Transistor) formed on an SOI (Silicon On Insulator) substrate.

2. Description of the Background Art

A semiconductor device used for a portable device such as a notebook computer and a portable terminal is operated by a battery loaded in the portable device. Therefore, a portable device using a semiconductor device with less power consumption can be used for longer time with one charge of the battery. For this reason, it is desirable that a semiconductor device with less power consumption should be used in the portable device.

To reduce the power consumption of the semiconductor device, it is effective to reduce a power-supply voltage. For the power consumption of a CMOS digital circuit, for example, is in proportion to the square of the power-supply voltage. Since a drain current decreases when the power-supply voltage becomes three times as high as the threshold voltage or lower, the operating speed of the circuit largely decreases. Therefore, when the power-supply voltage is reduced, it is necessary to reduce the threshold voltage at the same time. A leak current flowing in a MOSFET when it is in an off state (when an gate-source voltage becomes the threshold voltage or lower), i.e., an off current, however, increases as the threshold voltage decreases. For this reason, when the threshold voltage is merely reduced, the power consumption in an off state increases. Further, a MOSFET used in a dynamic circuit, a memory cell array and the like sometimes causes malfunction when the threshold voltage is reduced.

Therefore, to reduce the power consumption of the semiconductor device without reducing the operating speed of the circuit, it is convenient that the threshold voltage can be set high in an off state and low in an on state, and as a structure to achieve this, a DTMOSFET is proposed (see U.S. Pat. No. 5,559,368).

FIG. 48 is a schematic diagram showing a structure of a DTMOSFET in the background art. An SOI substrate 101 has a multilayered structure in which a silicon substrate 102, a BOX (Buried OXide) layer 103 and a silicon layer 104 are layered in this order. The SOI substrate 101 can be formed by a well-known method such as the SIMOX (Separation by IMplanted OXygen) and the BESOI (Bonded and Etchback SOI).

In the silicon layer 104 formed are an $n^+$-type source region 156 and an $n^+$-type drain region 157 which are paired with a body region (channel region) 115 sandwiched therebetween. On the body region 115, a gate electrode 109 is formed with a gate oxide film 105 interposed therebetween. The gate electrode 109 has a multilayered structure in which a doped polysilicon layer 106, a metal nitride layer 107 and a metal layer 108 are layered on the gate oxide film 105 in this order. The characteristic feature of the DTMOSFET lies in electrical connection between the gate electrode 109 and the body region 115. A ground voltage is applied to the source region 156 and a power supply 158 such as a battery is connected to the drain region 157.

FIG. 49 is a plan view schematically showing the structure of the DTMOSFET in the background art. FIG. 50 is a cross section showing a cross-sectional structure taken along the line X100 of FIG. 49. Referring to FIG. 50, an STI (Shallow Trench Isolation) 117 is formed in the silicon layer 104 in the isolation region of the SOI substrate 101. A bottom surface of the STI 117 is in contact with an upper surface of the BOX layer 103.

In an element formation region of the SOI substrate 101 defined by the STI 117, a $p^+$-type impurity diffusion region 111 adjacent to the STI 117 and the body region 115 adjacent to the impurity diffusion region 111 are formed in the silicon layer 104. On the body region 115, the gate oxide film 105 and the gate electrode 109 are formed and on the gate electrode 109, an interlayer insulating film 112 is formed.

On the impurity diffusion region 111, a metal plug 114 such as aluminum is formed. The metal plug 114 is also in contact with the gate electrode 109. The gate electrode 109 and the body region 115 are electrically connected to each other with the metal plug 114 and the impurity diffusion region 111 interposed therebetween.

Further, there may be a structure of the DTMOSFET, as shown in FIG. 51, where the metal plug 114 is so formed as to reach the upper surface of the BOX layer 103 and the metal plug 114 and the body region 115 are brought into direct contact with each other, instead of providing the impurity diffusion region 111 in the silicon layer 104 below the metal plug 114.

Referring to FIG. 49, the STI 117 is formed around the source region 156, the drain region 157, the body region 115 and the impurity diffusion region 111 with the bold line of the figure as a boundary.

Next, the electrical characteristics of the DTMOSFET will be discussed. In the following discussion, a DTMOSFET using the SOI substrate is referred to as "SOI-DTMOSFET" and an ordinary MOSFET in which the SOI substrate is used and the gate electrode and the body region are not connected to each other is referred to as "SOI-MOSFET", for distinction. The SOI-DTMOSFET has excellent characteristics when a body voltage is 0.6 V or lower, as compared with the SOI-MOSFET. When the body voltage is 0.6 V or lower, it is possible to prevent a parasitic bipolar transistor using the source region 156 as an emitter, the body region 115 as a base and the drain region 157 as a collector from being driven and further prevent generation of power consumption accompanying the operation of the parasitic bipolar transistor.

Further, in a MOSFET using an ordinary bulk substrate, not the SOI substrate, (hereinafter, referred to as "bulk-MOSFET"), the same effect can be achieved by connecting the silicon substrate and the gate electrode to each other. In the SOI-DTMOSFET, however, respective bottom surfaces of the source region 156 and the drain region 157 can be brought into contact with the upper surface of the BOX layer 103, as shown in FIG. 48, and therefore the area of a pn junction formed of the $n^+$-type source region 156, the $n^+$-type drain region 157 and the p-type silicon layer 104 can be reduced. For this reason, in the SOI-DTMOSFET, a pn junction capacitance and a base current can be reduced as compared with the bulk-MOSFET.

Furthermore, since a depletion layer capacitance decreases as the pn junction capacitance decreases, as shown in FIG. 52, the SOI-DTMOSFET shows more excellent subthreshold characteristics than the bulk-MOSFET, regardless of whether NMOS or PMOS. Further, in the graph of FIG. 52, the horizontal axis indicates a gate voltage $V_G$ (V) and the vertical axis indicates the drain current $I_D$ (A), and "S" in the figure represents a subthreshold coefficient.

FIG. 53 is a graph showing a relation between a body bias voltage (the body voltage relative to the source) $V_{bs}$ and the threshold voltage $V_{th}$ in n-type SOI-MOSFET and SOI-DTMOSFET. Usually, a body voltage which is a reverse bias relative to the source region (in other words, $V_{bs}<0$) is applied to the body region of the SOI-MOSFET. As indicated by the characteristics T1, the threshold voltage $V_{th}$ increases as the absolute value of the body bias voltage $V_{bs}$ increases. The minimum value of the threshold voltage $V_{th}$ in the SOI-MOSFET is obtained when the body bias voltage $V_{bs}$ is 0 V, being about 0.4 V in the example shown in FIG. 53.

In contrast to this, in the SOI-DTMOSFET, since the gate electrode and the body region are connected to each other, a body voltage which is a forward bias relative to the source region (in other words, $V_{bs}>0$) is applied to the body region of the SOI-DTMOSFET. In FIG. 53, the threshold voltage $V_{th}$ of the SOI-DTMOSFET is obtained as a voltage value (about 0.3 V) at an intersection of the characteristics T1 and characteristics T2 ($V_{GS}=V_{BS}$). As compared with the minimum value, about 0.4 V, of the threshold voltage $V_{th}$ in the SOI-MOSFET, it can be seen that the threshold voltage $V_{th}$ is reduced in the SOI-DTMOSFET.

In the background-art DTMOSFET, however, the impurity diffusion region 111 for connecting the metal plug 114 and the body region 115 is formed in the element formation region of the SOI substrate 101, as shown in FIG. 50. Alternatively, as shown in FIG. 51, part of the metal plug 114 which exists inside the silicon layer 104 is formed in the element formation region of the SOI substrate 101.

Therefore, since a space to form a gate-body contact region such as the impurity diffusion region 111 is needed in the silicon layer 104, the area of the element formation region increases by the width of the gate-body contact region (i.e., an area penalty AP 100 of FIGS. 50 and 51). As a result, there arises a problem of an increase in chip area.

SUMMARY OF THE INVENTION

The present invention is directed to a semiconductor device. According to a first aspect of the present invention, the semiconductor device comprises: an SOI substrate of multilayered structure in which a semiconductor substrate, an insulating layer and a semiconductor layer are layered in this order; an isolation insulating film formed in the semiconductor layer in an isolation region of the SOI substrate; a body region selectively formed in the semiconductor layer in an element formation region of the SOI substrate defined by the isolation insulating film; a gate electrode formed on the body region with a gate insulating film interposed therebetween; an interlayer insulating film covering the isolation insulating film and the gate electrode; a contact hole so selectively formed in the interlayer insulating film as to expose part of the gate electrode and overlap in plane view part of the isolation insulating film; and a connection body including a conductor formed in the contact hole, for electrically connecting the gate electrode and the body region, and in the semiconductor device of the first aspect, at least part of a bottom surface of the connection body overlaps in plane view the isolation insulating film.

Preferably, in the semiconductor device of the first aspect, the conductor is a metal plug.

Preferably, in the semiconductor device of the first aspect, the conductor is a semiconductor in which an impurity is introduced.

Preferably, in the semiconductor device of the first aspect, the isolation insulating film is a full-isolation insulating film formed extending from an upper surface of the semiconductor layer to an upper surface of the insulating layer.

Preferably, in the semiconductor device of the first aspect, the isolation insulating film is a partial-isolation insulating film having a bottom surface which does not reach an upper surface of the insulating layer.

Preferably, the semiconductor device of the first aspect further comprises a sidewall formed on a side surface of the gate electrode.

According to a second aspect of the present invention, in the semiconductor device of the first aspect, the whole of the bottom surface of the connection body overlaps the isolation insulating film below the contact hole.

According to a third aspect of the present invention, in the semiconductor device of the first aspect, part of the bottom surface of the connection body overlaps the isolation insulating film below the contact hole.

According to a fourth aspect of the present invention, in the semiconductor device of the third aspect, the contact hole is formed above an upper surface of the semiconductor layer.

According to a fifth aspect of the present invention, in the semiconductor device of the fourth aspect, the gate electrode has a first semiconductor layer of a first conductivity type, and the connection body has a second semiconductor layer of a second conductivity type which is different from the first conductivity type, the semiconductor device further comprising an insulating film formed between the first semiconductor layer and the second semiconductor layer.

According to a sixth aspect of the present invention, the semiconductor device of any one of the first to fifth aspects further comprises a barrier film formed in an interface between the connection body and the body region.

According to a seventh aspect of the present invention, in the semiconductor device of any one of the first to sixth aspects, the gate electrode is a gate electrode having light transmissivity.

According to an eighth aspect of the present invention, the semiconductor device comprises: an SOI substrate of multilayered structure in which a semiconductor substrate, an insulating layer and a semiconductor layer are layered in this order, having a first element formation region and a second element formation region which are isolated from each other by an isolation region; an isolation insulating film formed in the semiconductor layer in the isolation region; a first semiconductor element formed in the first element formation region, having a first body region selectively formed in the semiconductor layer and a first gate electrode formed on the first body region with a first gate insulating film interposed therebetween; a second semiconductor element formed in the second element formation region, having a second body region selectively formed in the semiconductor layer and a second gate electrode formed on the second body region with a second gate insulating film interposed therebetween; an interlayer insulating film covering the isolation insulating film and the first and second gate electrodes; a contact hole so selectively formed in the interlayer insulating film as to expose part of the first gate electrode and part of the second gate electrode; and a connection body including a conductor formed in the contact hole, for electrically connecting the first and second gate electrodes and the first and second body regions.

According to a ninth aspect of the present invention, in the semiconductor device of the eighth aspect, at least part of a bottom surface of the connection body overlaps in plane view the isolation insulating film.

Preferably, in the semiconductor device of the ninth aspect, the whole of the bottom surface of the connection body overlaps the isolation insulating film.

According to a tenth aspect of the present invention, the semiconductor device comprises: an SOI substrate of multilayered structure in which a semiconductor substrate, an insulating layer and a semiconductor layer are layered in this order; an isolation insulating film formed in the semiconductor layer in an isolation region of the SOI substrate; a body region selectively formed in the semiconductor layer in an element formation region of the SOI substrate defined by the isolation insulating film; a gate electrode formed on the body region with a gate insulating film interposed therebetween; and bias generation means connected between the body region and the gate electrode, for limiting a body voltage which is to be applied to the body region to 0.6 V or lower.

According to an eleventh aspect of the present invention, the semiconductor device of the tenth aspect further comprises: an interlayer insulating film covering the isolation insulating film and the gate electrode; a contact hole so selectively formed in the interlayer insulating film as to expose part of the gate electrode and overlap in plane view part of the isolation insulating film; and a connection body including a conductor formed in the contact hole, being connected to the body region, wherein at least part of a bottom surface of the connection body overlaps in plane view the isolation insulating film below the contact hole.

Preferably, the semiconductor device of the eleventh aspect further comprises: a sidewall made of an insulating film for preventing the gate electrode and the conductor from coming into electrical contact.

In the semiconductor device of the first aspect of the present invention, since at least part of the connection body is formed in the isolation region, it is possible to avoid or suppress generation of an area penalty which is generated when the connection body is formed in the element formation region.

In the semiconductor device of the second aspect of the present invention, since the whole connection body is formed in the isolation region, it is possible to completely avoid generation of the area penalty which is generated when the connection body is formed in the element formation region.

In the semiconductor device of the third aspect of the present invention, since part of the connection body is formed in the isolation region, it is possible to suppress generation of the area penalty which is generated when the connection body is formed in the element formation region. Moreover, since the contact area between the connection body and the body region increases, the contact resistance therebetween decreases.

In the semiconductor device of the fourth aspect of the present invention, since it is not necessary to etch the semiconductor layer to form the contact hole inside an upper surface of the semiconductor layer, it is possible to avoid a damage of the semiconductor layer due to the etching.

In the semiconductor device of the fifth aspect of the present invention, since the insulating film is interposed between the first and second semiconductor layers which have different conductivity types, it is possible to avoid formation of a pn junction between the first and second semiconductor layers.

In the semiconductor device of the sixth aspect of the present invention, it is possible to suppress thermal diffusion of atoms constituting the connection body into the body region through various heat treatments in the manufacturing process.

The semiconductor device of the seventh aspect of the present invention can be used as a photosensor.

In the semiconductor device of the eighth aspect of the present invention, since the first semiconductor element and the second semiconductor element share one connection body, it is possible to achieve size-reduction of the semiconductor device as compared with a case where the connection bodies are individually formed.

In the semiconductor device of the ninth aspect of the present invention, since at least part of the connection body is formed in the isolation region, it is possible to avoid or suppress generation of the area penalty which is generated when the connection body is formed in the element formation region.

In the semiconductor device of the tenth aspect of the present invention, since the bias generation means limits the body voltage to 0.6 V or lower even if a voltage of 0.6 V or higher is applied to the gate electrode, it is possible to prevent a parasitic bipolar transistor from being driven.

In the semiconductor device of the eleventh aspect of the present invention, since at least part of the connection body is formed in the isolation region, it is possible to avoid or suppress generation of the area penalty which is generated when the connection body is formed in the element formation region.

An object of the present invention is to provide a semiconductor device which can avoid or suppress generation of an area penalty accompanying formation of the gate-body contact region inside the silicon layer in the SOI-DTMOSFET.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross section showing a cross-sectional structure of the DTMOSFET of FIG. 1;

FIGS. 3 to 6 are cross sections showing a method of manufacturing the DTMOSFET of FIG. 2 step by step;

FIG. 24 is a cross section showing a cross-sectional structure of the DTMOSFET of FIG. 23;

FIG. 32 is a cross section showing a fifth variation of the DTMOSFET in accordance with the third preferred embodiment of the present invention;

FIG. 33 is a cross section showing a structure of a DTMOSFET in accordance with a fourth preferred embodiment of the present invention;

FIGS. 34 to 37 are cross sections showing a method of manufacturing the DTMOSFET of FIG. 33 step by step;

FIG. 46 is a graph showing characteristics of a gate-body current $I_{GB}$ related to a gate-body voltage $V_{GB}$;

FIG. 47 is a graph showing characteristics of a photoelectric current $I_P$ and a gain related to the intensity D of an irradiation light;

FIG. 50 is a cross section showing a cross-sectional structure of the DTMOSFET of FIG. 49;

DESCRIPTION OF THE PREFERRED EMBODIMENTS

The First Preferred Embodiment

Figure 1:
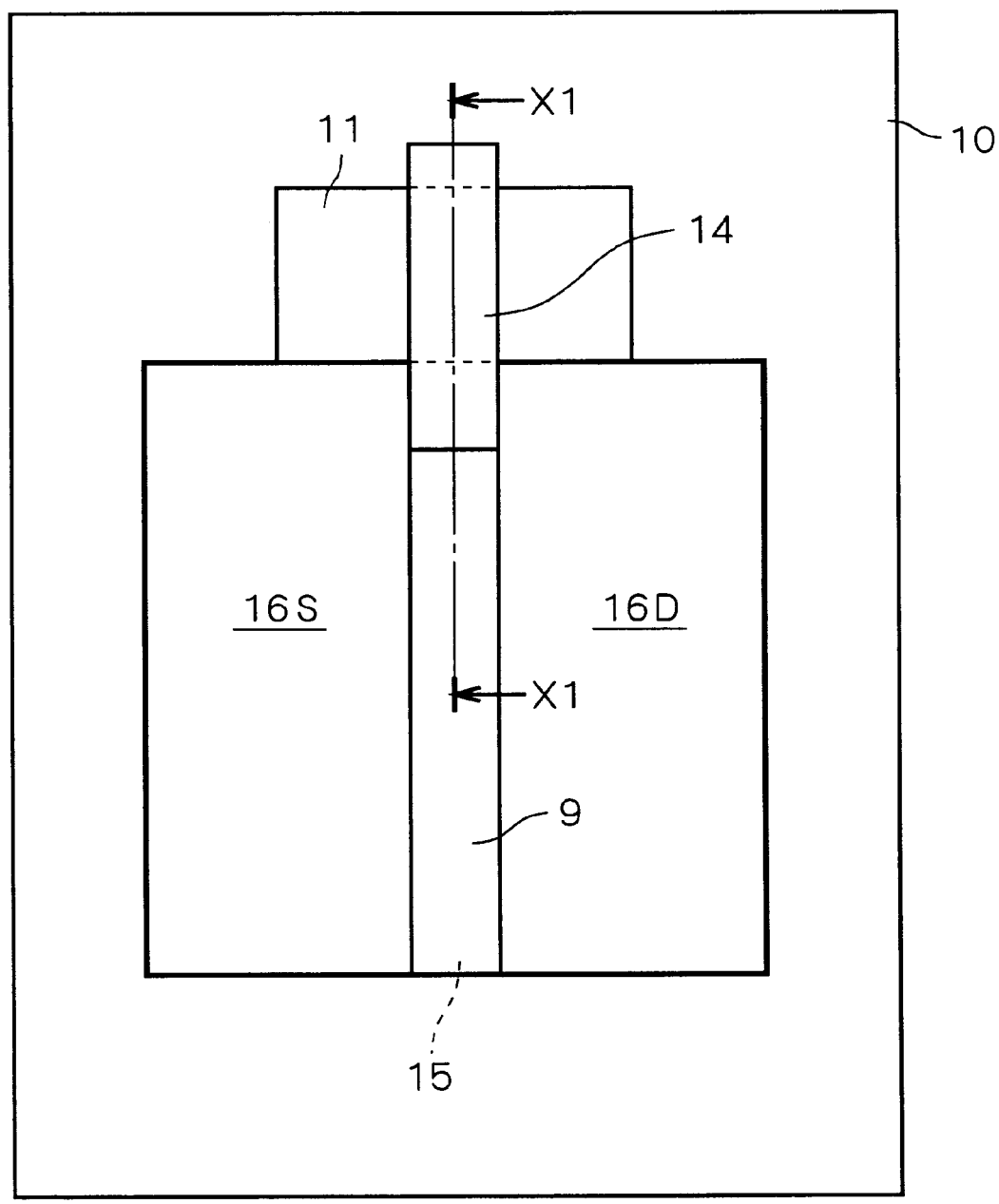
FIG. 1 is a plan view schematically showing a structure of a DTMOSFET in accordance with a first preferred embodiment of the present invention.

FIG. 1 is a plan view schematically showing a structure of a DTMOSFET in accordance with the first preferred embodiment of the present invention and FIG. 2 is a cross section showing a cross-sectional structure taken along the line X1 of FIG. 1. Referring to FIG. 2, an SOI substrate 1 has a multilayered structure in which a silicon substrate 2, a BOX layer 3 and a silicon layer 4 are layered in this order. In an isolation region of the SOI substrate 1, an STI 10 is formed in the silicon layer 4. The STI 10 is formed extending from an upper surface of the silicon layer 4 to an upper surface of the BOX layer 3. Instead of the STI 10 of trench isolation type, an isolation insulating film of LOCOS isolation type may be formed. Further, in an end portion of an isolation region, a p$^+$-type impurity diffusion region 11 is selectively formed, being buried in part of an upper surface of the STI 10, in the upper surface of the silicon layer 4.

Furthermore, in the element formation region of the SOI substrate 1 defined by the STI 10, a p-type body region 15 which is in contact with a side surface of the STI 10 below the impurity diffusion region 11 and a side surface of the impurity diffusion region 11 is formed in the silicon layer 4. On the body region 15, a gate electrode 9 is formed with a gate oxide film 5 interposed therebetween. The gate electrode 9 has a multilayered structure in which an n$^+$-type doped polysilicon layer 6, a tungsten nitride layer 7 and a tungsten layer 8 are layered on the gate oxide film 5 in this order.

Further, an interlayer insulating film 12 made of silicon oxide is entirely formed covering respective exposed surfaces of the gate electrode 9, the impurity diffusion region 11 and the STI 10. A predetermined bias voltage may be or may not be applied to the impurity diffusion region 11. On the impurity diffusion region 11, and on an end portion of the gate electrode 9 on the side adjacent to the impurity diffusion region 11, a contact hole CH1 is formed in the interlayer insulating film 12. A conductor is formed inside the contact hole CH1. Specifically, a tungsten plug 14 is buried in the contact hole CH1 with a barrier film 13 interposed therebetween. As the material of the barrier film 13, TiN, WN$_x$, TaW, TaN, Ta, TaCN, TaWN, TiCN, WCN and the like may be used.

The tungsten plug 14 is in contact with the impurity diffusion region 11 with the barrier film 13 interposed therebetween, and also in contact with part of an upper surface of the gate electrode 9 and a side surface thereof with the barrier film 13 interposed therebetween. This makes an electrical connection between the gate electrode 9 and the body region 15 with the barrier film 13, the tungsten plug 14 and the impurity diffusion region 11 interposed therebetween. In other words, the barrier film 13, the tungsten plug 14 and the impurity diffusion region 11 work as a connection body to electrically connect the gate electrode 9 and the body region 15 to each other in the DTMOSFET of the first preferred embodiment. Further, in the first preferred embodiment, the whole bottom surface of the connection body two-dimensionally overlaps (in other words, overlaps in plane view) the STI 10. Further, the contact in the region to connect the gate electrode 9 and the body region 15 may be an ohmic contact or a Schottky contact (diode).

Referring to FIG. 1, the STI 10 is formed around a source region 16S, a drain region 16D and the body region 15 with the bold line of the figure as a boundary. In other words, the bold line of the figure represents a boundary between the isolation region and the element formation region. The impurity diffusion region 11 is formed in the isolation region.

FIGS. 3 to 6 are cross sections showing a method of manufacturing the DTMOSFET of FIG. 2 step by step. Referring to FIG. 3, first, an STI 17 is formed in the silicon layer 4 in the isolation region of the SOI substrate 1 by a well-known trench isolation technique. Next, an impurity such as boron is introduced into the silicon layer 4 by the ion implantation method in the element formation region of the SOI substrate 1 to form the body region 15. Subsequently, the gate oxide film 5 and the gate electrode 9 are formed in this order on the body region 15 by the thermal oxidation method, the CVD method and the like. Using the gate electrode 9 as an implantation mask, an impurity such as phosphorus and arsenic is shallowly introduced into the upper surface of the silicon layer 4 by the ion implantation method, to form an n$^-$-type impurity region of relatively low concentration (not shown).

Next, a sidewall 18 made of silicon oxide is formed on a side surface of the gate electrode 9 by the CVD method and the anisotropic dry etching method. Subsequently, using the gate electrode 9 and the sidewall 18 as an implantation mask, an impurity such as phosphorus and arsenic is deeply introduced into the upper surface of the silicon layer 4 by the ion implantation method, to form an n$^+$-type impurity region of relatively high concentration (not shown). This forms the source region 16S and the drain region 16D made of the n$^-$-type impurity region and the n$^+$-type impurity region (not shown in FIG. 3).

Referring to FIG. 4, the interlayer insulating film 12 made of silicon oxide is entirely formed on the structure of FIG. 3 by the CVD method and the like. Through photolithography, a photoresist 19 having a predetermined opening pattern is formed on the interlayer insulating film 12.

Figure 5:
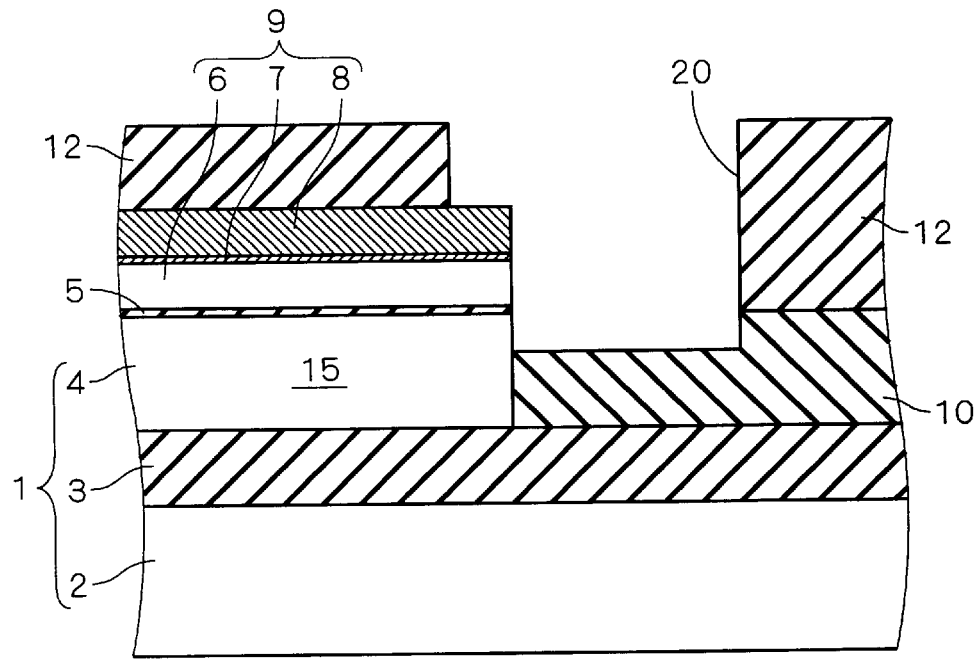

Referring to FIG. 5, using the photoresist 19 as an etching mask, the interlayer insulating film 12 and the sidewall 18 are etched by the anisotropic dry etching method with high etching rate in the depth direction of the SOI substrate 1 and etch selectivity to the silicon oxide. This exposes the upper surface of the end portion of the gate electrode 9 and the side surface thereof and part of the upper surface of the silicon layer 4. Next, using the photoresist 19 as an etching mask, the exposed upper surface of the silicon layer 4 is etched by a predetermined depth by the anisotropic dry etching method with high etching rate in the depth direction of the SOI substrate 1 and etch selectivity to the silicon. Through the above steps, a recess 20 can be selectively formed in the interlayer insulating film 12 and the silicon layer 4 so that part of the gate electrode 9 may be exposed and the recess 20 may two-dimensionally overlaps part of the STI 10. After that, the photoresist 19 is removed.

Figure 6:
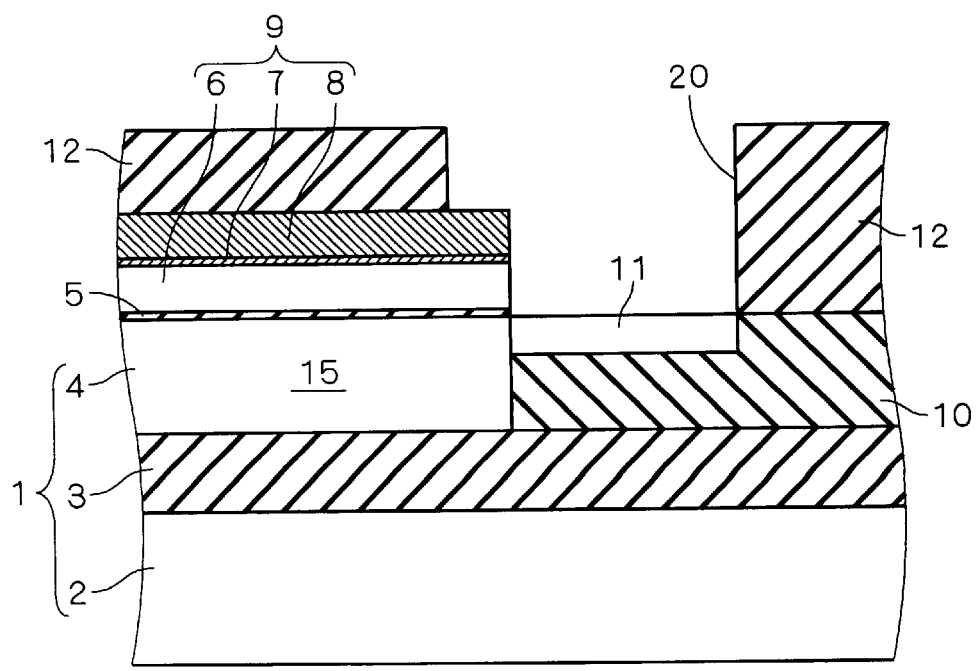

Referring to FIG. 6, the silicon is grown in a horizontal direction by the epitaxial growth method in which gas such as $B_2H_6$ and $BH_3$ is mixed into source gas such as $SiCl_4$, $SiHCl_3$, $SiH_2Cl_2$ and $SiH_4$, using the silicon of the body region 15 as a seed crystal, to form the impurity diffusion region 11 on a bottom surface of the recess 20. The upper surface of the impurity diffusion region 11 coincides with the upper surface of the STI 10 in the first preferred embodiment. Further, the method in which an epitaxial layer is grown in the horizontal direction, using the substrate as a seed crystal, is referred to as an ELO (Epitaxial Lateral Overgrowth). After that, the barrier film 13 and the tungsten plug 14 are entirely formed in this order, and then an etchback is performed by the CMP (Chemical Mechanical Polishing) method, to obtain the structure of FIG. 2. The process of serial steps in which a trench for plug is made in the upper surface of the insulating film and filled with the conductor, and then the upper surface of the conductor and insulating film are planarized by the CMP method is referred to as damascene process.

Further, instead of tungsten plug 14, a metal plug made of magnesium, platinum, aluminum, cobalt, titanium, molybdenum, zirconium, tantalum, copper, silver, gold and the like may be used.

Thus, in the semiconductor device of the first preferred embodiment, as shown in FIGS. 1 and 2, the impurity diffusion region 11 inside the SOI substrate 1, among the connection body (the barrier film 13, the tungsten plug 14 and the impurity diffusion region 11) for connecting the gate electrode 9 and the body region 15 to each other, is fully formed in the isolation region of the SOI substrate 1. Therefore, since it is possible to completely avoid generation of the area penalty (AP 100 of FIG. 50), which is generated when the impurity diffusion region 11 is formed in the element formation region, the chip area can be reduced.

Figure 7:
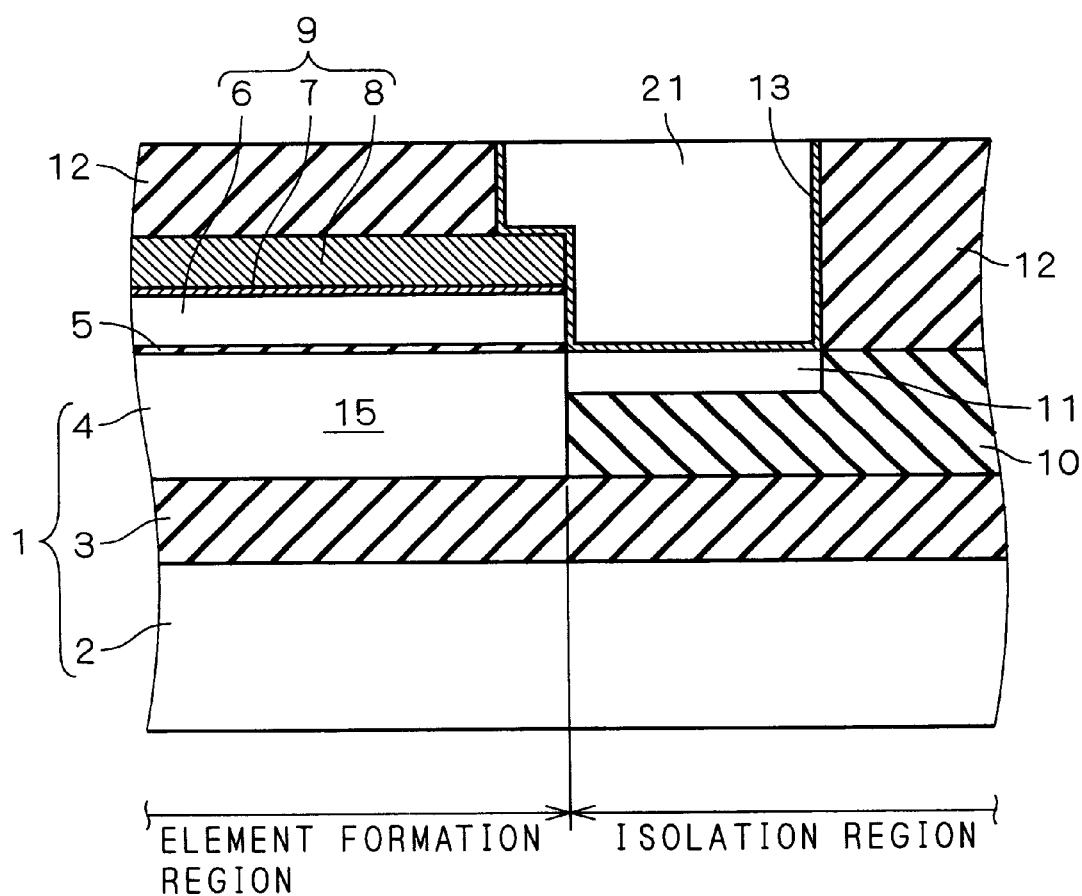
FIG. 7 is a cross section showing a first variation of the DTMOSFET in accordance with the first preferred embodiment of the present invention.

FIG. 7 is a cross section showing the first variation of the DTMOSFET in accordance with the first preferred embodiment of the present invention, corresponding to FIG. 2. Instead of the tungsten plug 14, a p$^+$-type doped polysilicon plug 21 is formed. The structure other than this is the same as that shown in FIG. 2.

Figure 8:
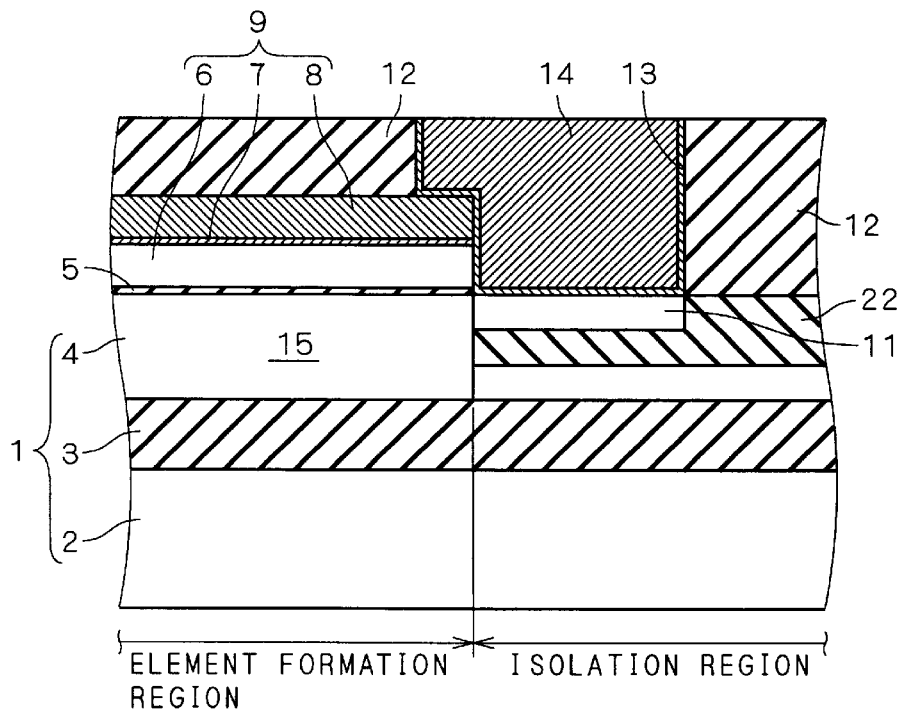
FIG. 8 is a cross section showing a second variation of the DTMOSFET in accordance with the first preferred embodiment of the present invention.

FIG. 8 is a cross section showing the second variation of the DTMOSFET in accordance with the first preferred embodiment of the present invention, corresponding to FIG. 2. Instead of the STI 10 extending from the upper surface of the silicon layer 4 to the upper surface of the BOX layer 3, an STI 22 having a bottom surface which does not reach the upper surface of the BOX layer 3 is formed. The structure other than this is the same as that shown in FIG. 2.

Figure 9:
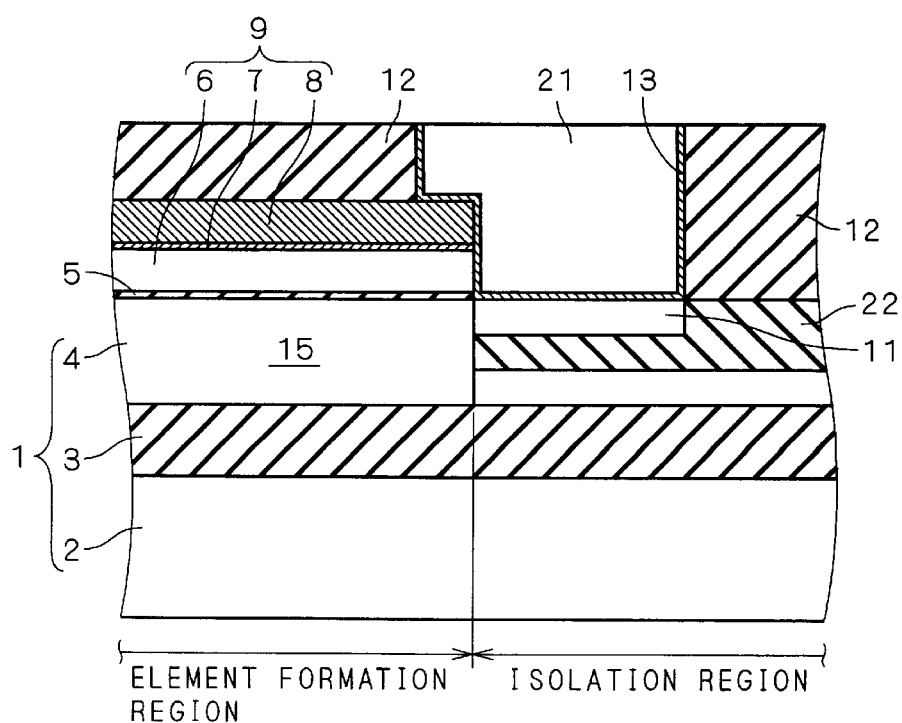
FIG. 9 is a cross section showing a third variation of the DTMOSFET in accordance with the first preferred embodiment of the present invention.

FIG. 9 is a cross section showing the third variation of the DTMOSFET in accordance with the first preferred embodiment of the present invention, corresponding to FIG. 2. Instead of the tungsten plug 14, the doped polysilicon plug 21 is formed and instead of the STI 10, the STI 22 is formed. The structure other than this is the same as that shown in FIG. 2.

Figure 10:
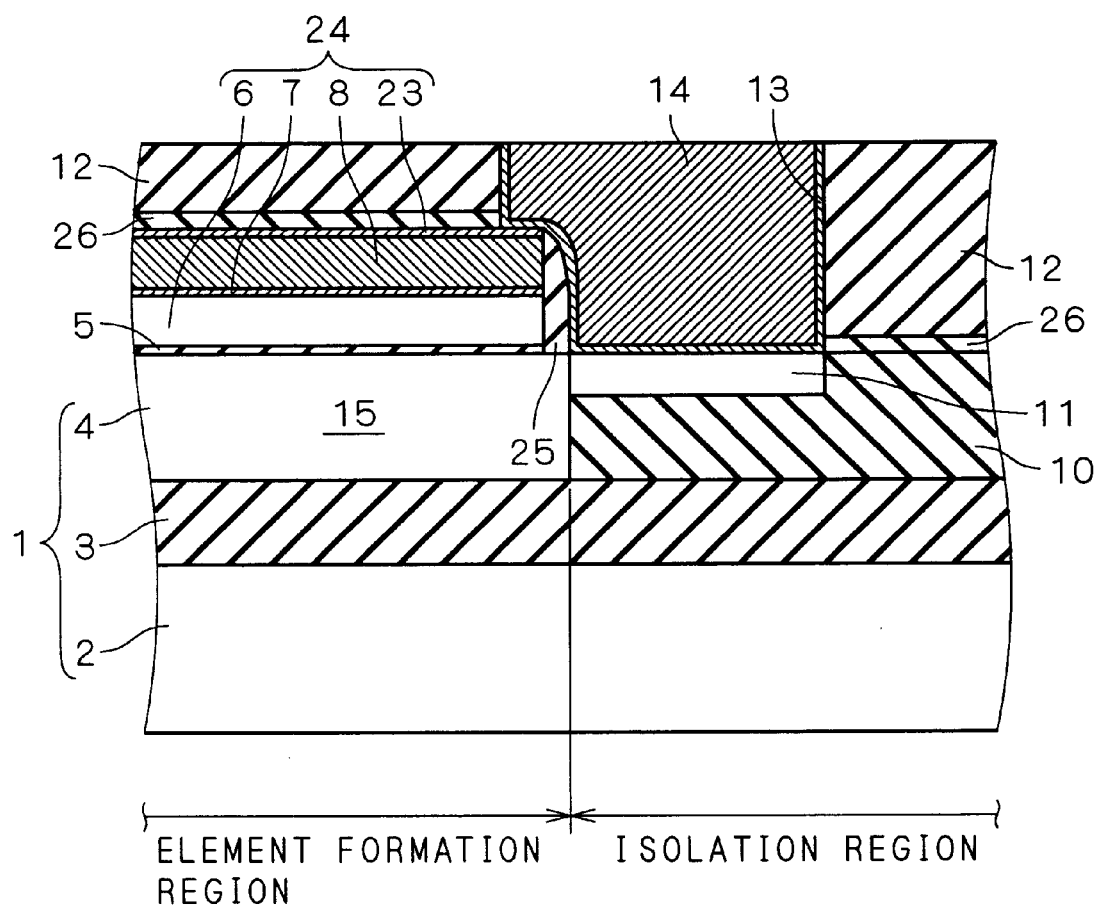
FIG. 10 is a cross section showing a fourth variation of the DTMOSFET in accordance with the first preferred embodiment of the present invention.

FIG. 10 is a cross section showing the fourth variation of the DTMOSFET in accordance with the first preferred embodiment of the present invention, corresponding to FIG. 2. The gate electrode 24 has a multilayered structure in which the doped polysilicon layer 6, the tungsten nitride layer 7, the tungsten layer 8 and a barrier layer 23 are layered on the gate oxide film 5 in this order. On a side surface of the gate electrode 24, a sidewall 25 is formed. As the material of the sidewall 25, silicon oxide, TEOS, silicon oxynitride and silicon nitride (or a composite film of these) may be used.

On the gate electrode 24, a silicon nitride film 26 is formed. Above the gate electrode 24, the interlayer insulating film 12 made of silicon oxide is formed on the silicon nitride film 26. Further, on the upper surface of the STI 10 in a portion where no impurity diffusion region 11 is formed, the silicon nitride film 26 is formed. Above the STI 10 in the portion, the interlayer insulating film 12 made of silicon oxide is formed on the silicon nitride film 26. The structure other than this is the same as that shown in FIG. 2.

Figure 11:
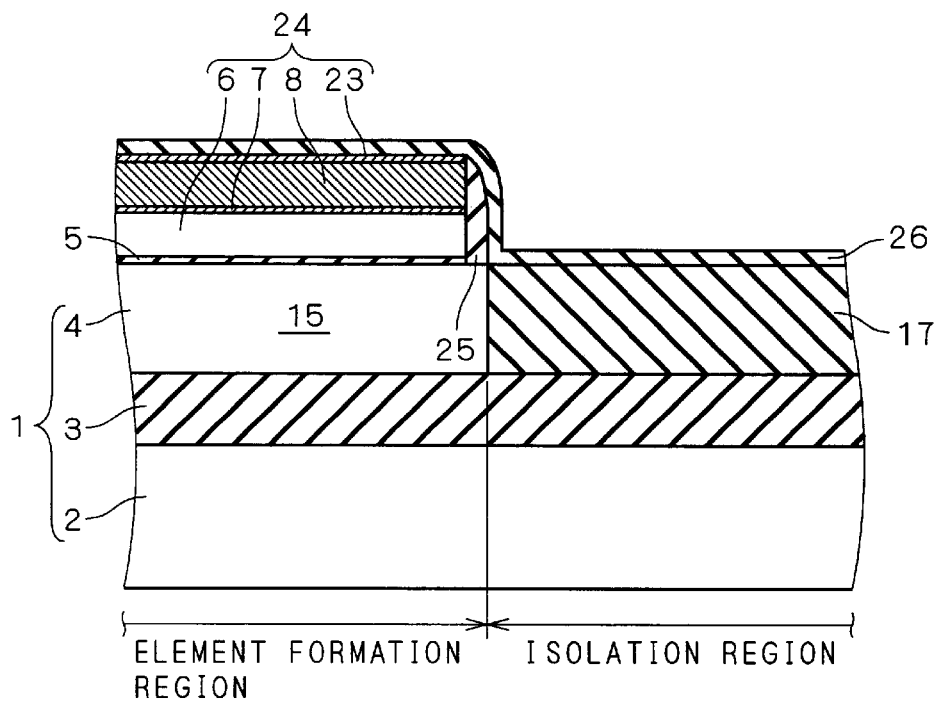
FIGS. 11 to 14 are cross sections showing a method of manufacturing the DTMOSFET of FIG. 10 step by step.

FIGS. 11 to 14 are cross sections showing a method of manufacturing the DTMOSFET of FIG. 10 step by step. Referring to FIG. 11, first, after the STI 17 is formed in the silicon layer 4 in the isolation region, the body region 15 is formed in the silicon layer 4 in the element formation region. Next, on the body region 15, the gate oxide film 5 and the gate electrode 24 are formed in this order.

Next, an n$^-$-type impurity region (not shown) is formed shallowly in the upper surface of the silicon layer 4 by the ion implantation method, using the gate electrode 24 as an implantation mask. Subsequently, the sidewall 25 is formed on the side surface of the gate electrode 24 by the CVD method and the anisotropic dry etching method. Then, an n$^+$-type impurity region (not shown) is formed deeply in the upper surface of the silicon layer 4 by the ion implantation method, using the gate electrode 24 and the sidewall 25 as an implantation mask. This forms the source region 16S and the drain region 16D made of the n$^-$-type impurity region and the n$^+$-type impurity region (not shown in FIG. 11). Subsequently, the silicon nitride film 26 is entirely formed by the CVD method.

Figure 12:
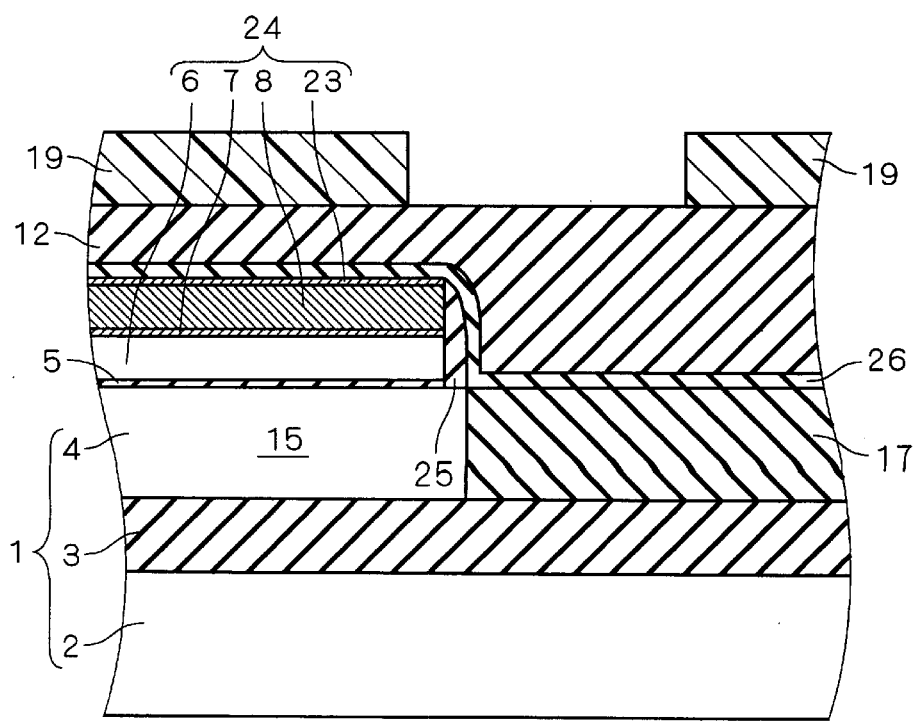

Referring to FIG. 12, the interlayer insulating film 12 made of silicon oxide is entirely formed on the structure of FIG. 11. Next, the photoresist 19 having a predetermined opening pattern is formed on the interlayer insulating film 12.

Figure 13:
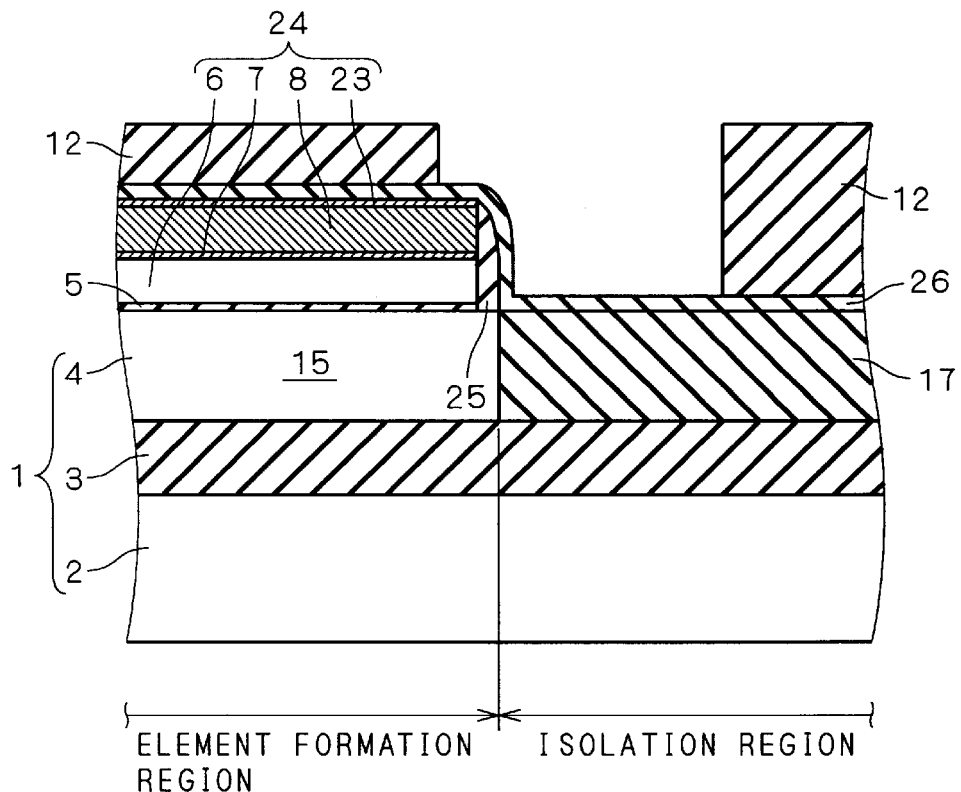

Referring to FIG. 13, using the photoresist 19 as an etching mask, the interlayer insulating film 12 is etched by the anisotropic dry etching method with high etching rate in the depth direction of the SOI substrate 1 and etch selectivity to the silicon oxide. This exposes the silicon nitride film 26.

Figure 14:
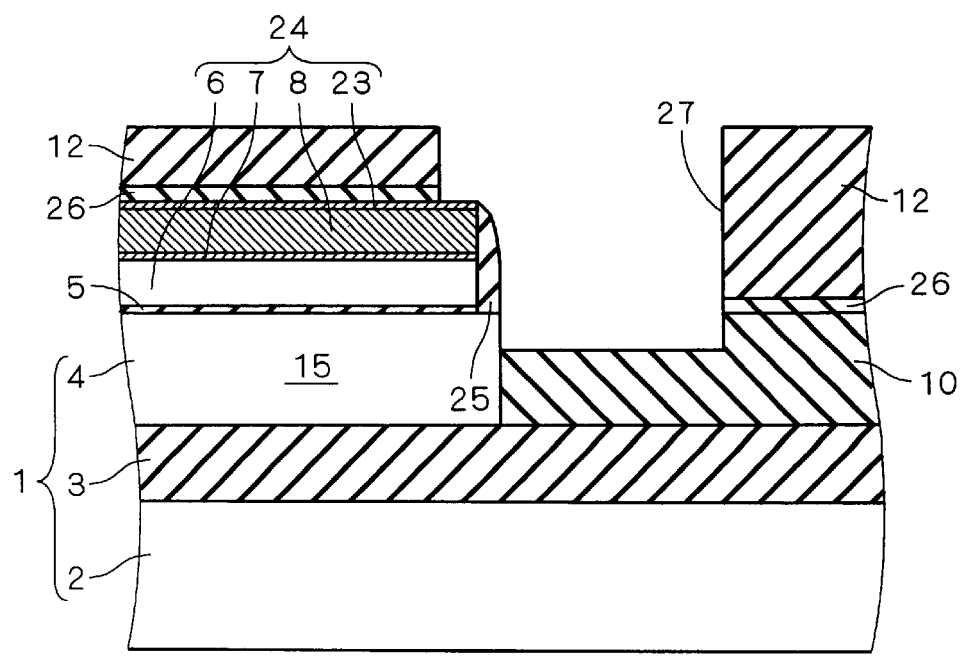

Referring to FIG. 14, the exposed silicon nitride film 26 is removed by etching. This exposes part of the upper surface of the gate electrode 24, the sidewall 25 and part of the upper surface of the STI 17. Next, the exposed upper surface of the silicon layer 4 is etched by a predetermined depth by the anisotropic dry etching method with high etching rate in the depth direction of the SOI substrate 1 and etch selectivity to the silicon. Through the above steps, a recess 27 can be selectively formed in the interlayer insulating film 12 and the silicon layer 4. After that, the photoresist 19 is removed.

The impurity diffusion region 11 whose upper surface is even with that of the STI 10 in level is formed on a bottom surface of the recess 27 by the epitaxial growth method. Next, after the barrier film 13 and the tungsten plug 14 are entirely formed in this order, an etchback is performed, to obtain the structure of FIG. 10.

Figure 15:
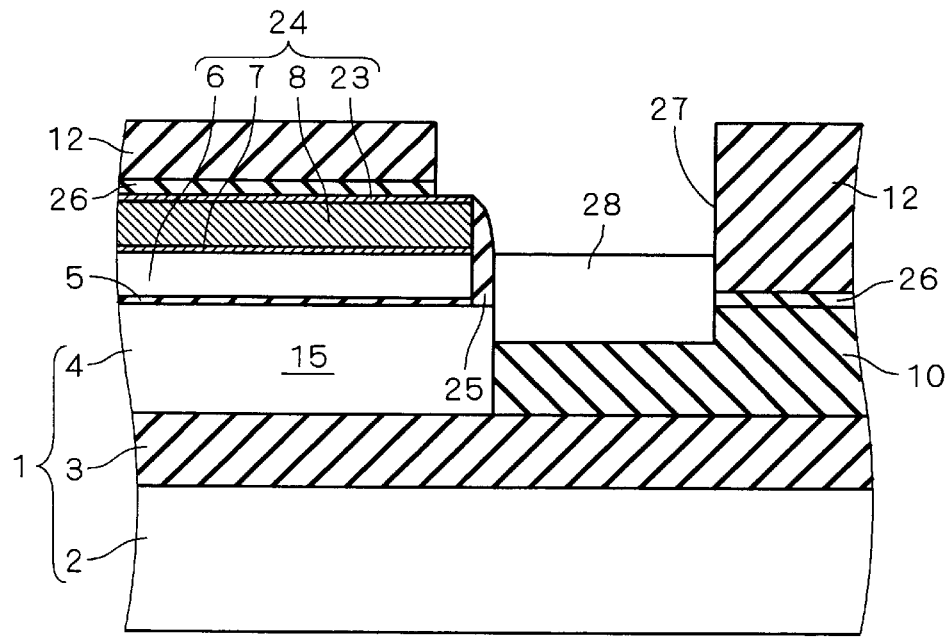
FIG. 15 is a cross section showing a first variation of the method of manufacturing the DTMOSFET of FIG. 10.
Figure 16:
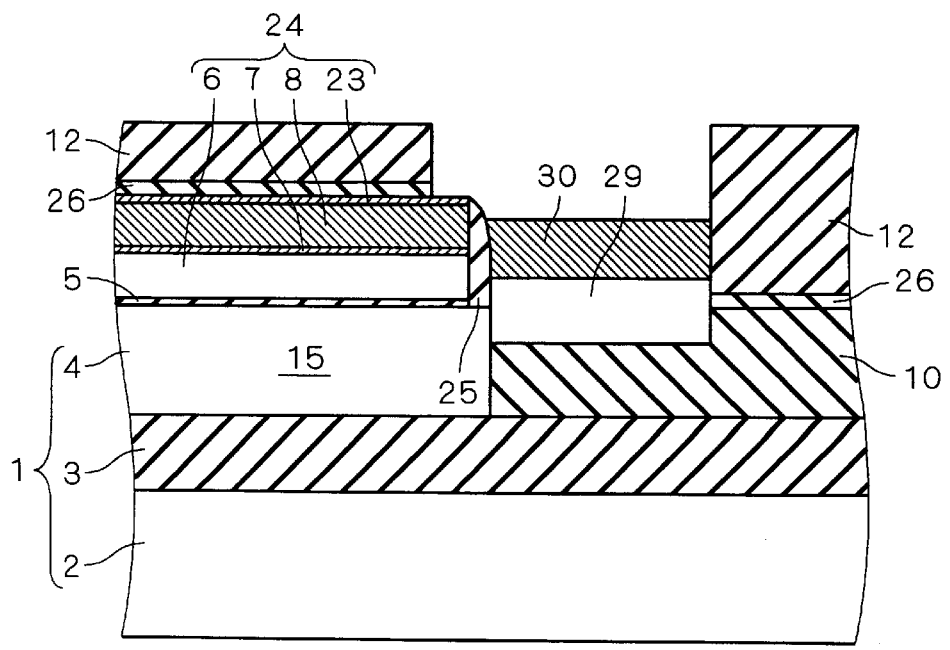
FIG. 16 is a cross section showing a second variation of the method of manufacturing the DTMOSFET of FIG. 10.

Further, as shown in FIG. 15, instead of the impurity diffusion region 11, an impurity diffusion region 28 whose upper surface is higher than that of the STI 10 in level may be formed. Furthermore, as shown in FIG. 16, instead of the impurity diffusion region 11, a multilayered structure consisting of an impurity diffusion region 29 and a silicide layer 30 may be formed. In FIG. 16, after the impurity diffusion region 29 is formed by the epitaxial growth method, a metal film such as cobalt, platinum, titanium, tungsten and nickel are entirely formed and the RTA (Rapid Thermal Annealing) is performed, to form the silicide layer 30 on the impurity diffusion region 29 in a self-align manner. Using the multilayered structure consisting of the impurity diffusion region 29 and the silicide layer 30 reduces the contact resistance with the tungsten plug 14.

Figure 17:
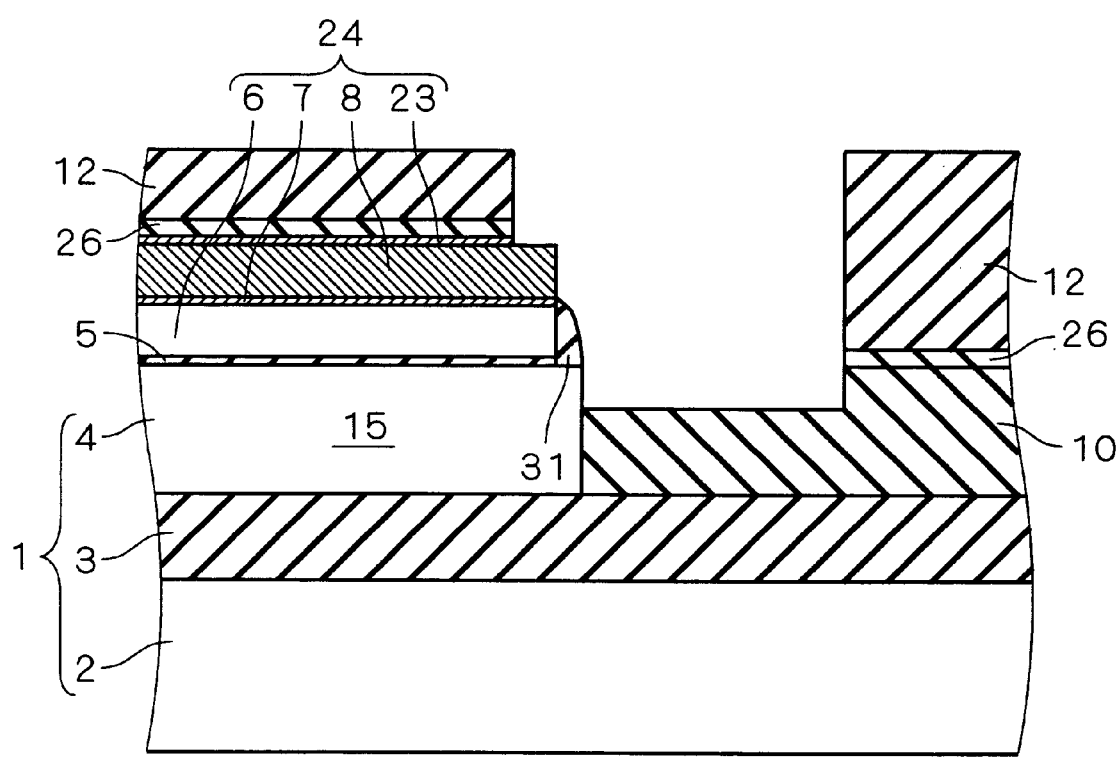
FIG. 17 is a cross section showing a third variation of the method of manufacturing the DTMOSFET of FIG. 10.

Further, there may be a method, as shown in FIG. 17, where the sidewall 25 is formed of silicon nitride and an overetching of the etching to remove the silicon nitride film 26 removes an upper portion of the sidewall 25 in the step of FIG. 14, to form a sidewall 31. This increases the area in which the tungsten plug 14 and the gate electrode 24 are in contact with each other with the barrier film 13 interposed therebetween and therefore the contact resistance between the tungsten plug 14 and the gate electrode 24 decreases.

Figure 18:
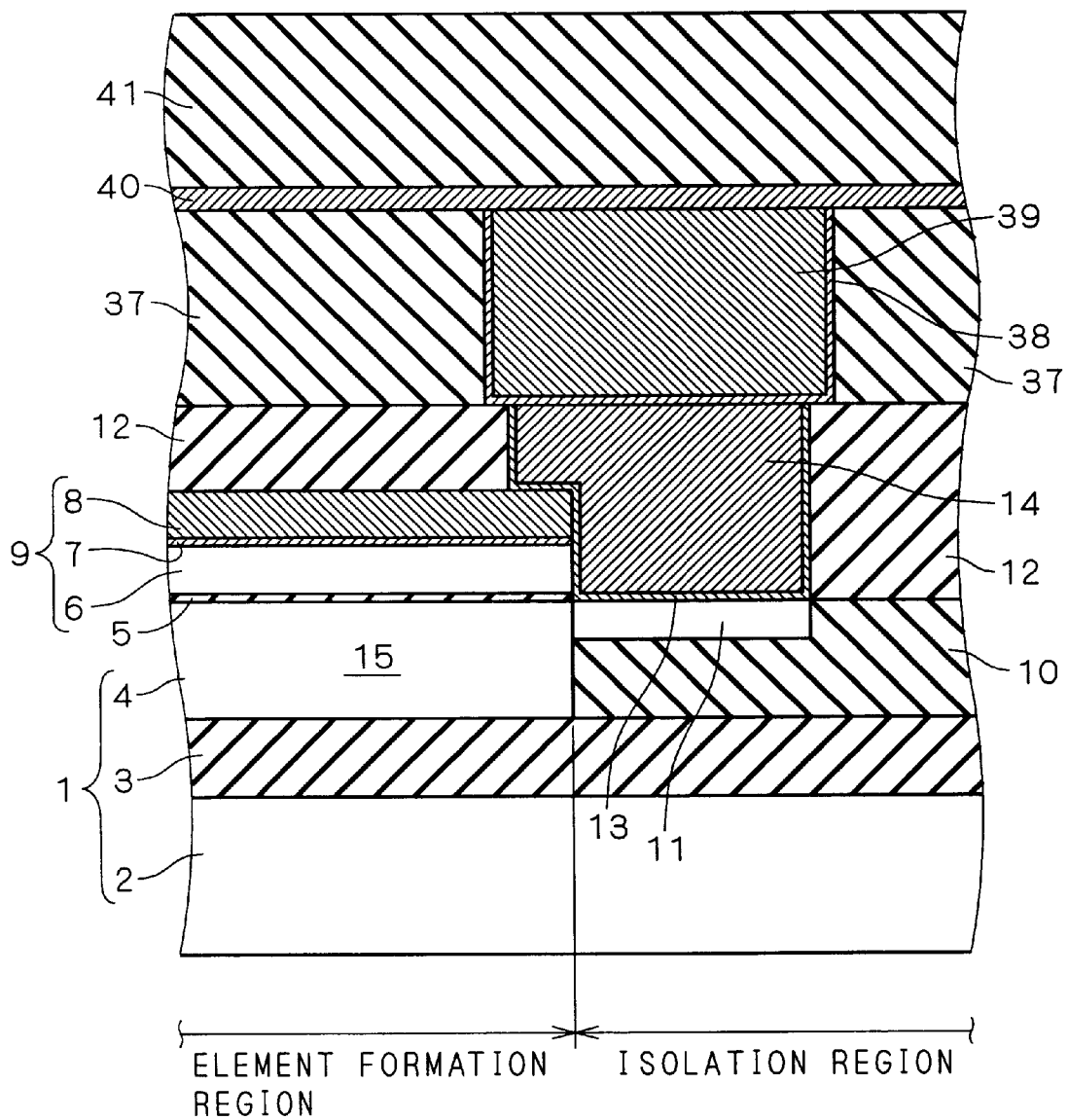
FIG. 18 is a cross section showing a fifth variation of the DTMOSFET in accordance with the first preferred embodiment of the present invention.

FIG. 18 is a cross section showing the fifth variation of the DTMOSFET in accordance with the first preferred embodiment of the present invention, corresponding to FIG. 2. An interlayer insulating film 37 is entirely formed on the structure shown in FIG. 2. In the interlayer insulating film 37, a barrier film 38 and a tungsten plug 39 are selectively formed. The tungsten plug 39 is in contact with the tungsten plug 14 with the barrier film 38 interposed therebetween. A metal wire 40 is formed on the interlayer insulating film 37 and is in contact with the tungsten plug 39. On the metal wire 40, an interlayer insulating film 41 is formed.

In the DTMOSFET, a common voltage is applied to the gate electrode 9 and the body region 15. Therefore, as shown in FIG. 18, the gate electrode 9 and the body region 15 can be connected in common to the metal wire 40 with the common tungsten plugs 14 and 39 interposed therebetween. This allows size reduction of the semiconductor device as compared with a case where a plug and a wire for the gate electrode 9 and those for the body region 15 are separately provided.

The Second Preferred Embodiment

Figure 19:
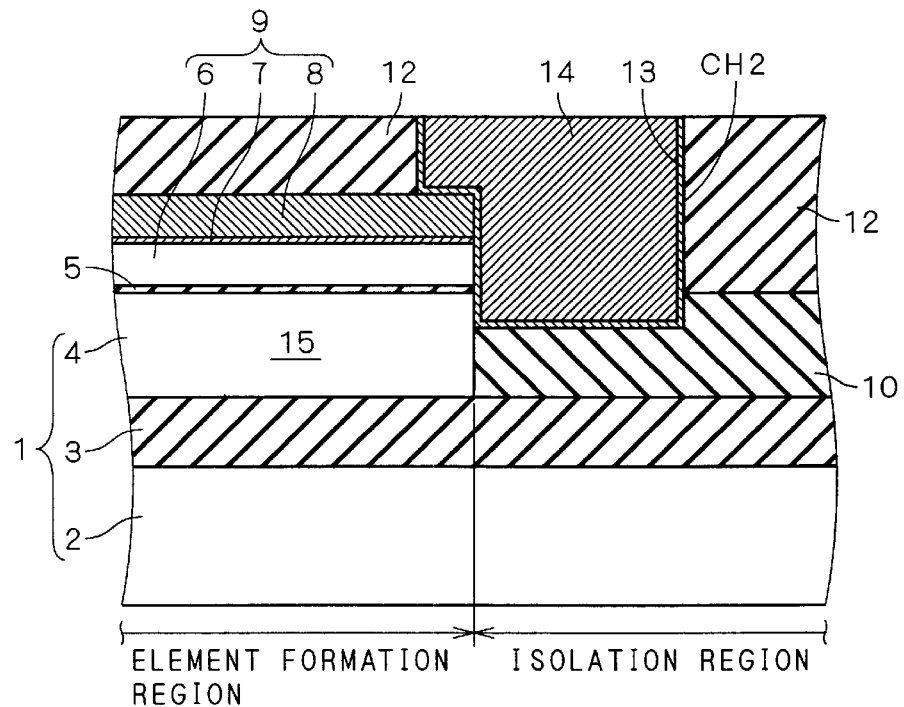
FIG. 19 is a cross section showing a structure of a DTMOSFET in accordance with a second preferred embodiment of the present invention.

FIG. 19 is a cross section showing a structure of a DTMOSFET in accordance with the second preferred embodiment of the present invention, corresponding to FIG. 2. In the DTMOSFET of the first preferred embodiment, the impurity diffusion region 11 is selectively formed in the upper surface of the STI 10 and the impurity diffusion region 11 and the tungsten plug 14 are connected to each other with the barrier film 13 interposed therebetween, to form the connection body consisting of the barrier film 13, the tungsten plug 14 and the impurity diffusion region 11.

In the DTMOSFET of the second preferred embodiment, instead of forming the impurity diffusion region 11, a contact hole CH2 is so formed as to extend from the upper surface of the interlayer insulating film 12 to the inside of the upper surface of the STI 10 and the contact hole CH2 is filled with the tungsten plug 14 with the barrier film 13 interposed therebetween. This establishes an electrical connection between the gate electrode 9 and the body region 15 to each other with the barrier film 13 and the tungsten plug 14 interposed therebetween. In other words, in the DTMOSFET of the second preferred embodiment, the barrier film 13 and the tungsten plug 14 work as a connection body to electrically connect the gate electrode 9 and the body region 15 to each other.

Referring to FIG. 2, for example, the impurity diffusion region 11 and the body region 15 are in direct contact with each other in the DTMOSFET of the first preferred embodiment. This causes thermal diffusion of the impurity such as boron contained in the impurity diffusion region 11 into the body region 15 through various heat treatments in the process of manufacturing the DTMOSFET, and as a result, sometimes the narrow channel effect becomes pronounced. In contrast, in the DTMOSFET of the second preferred embodiment, since the barrier film 13 is interposed between part of the tungsten plug 14 which is formed in the silicon layer 4 and the body region 15, it is possible to suppress the thermal diffusion of the metal atoms contained in the tungsten plug 14 into the body region 15 and suppress the narrow channel effect.

Figure 20:
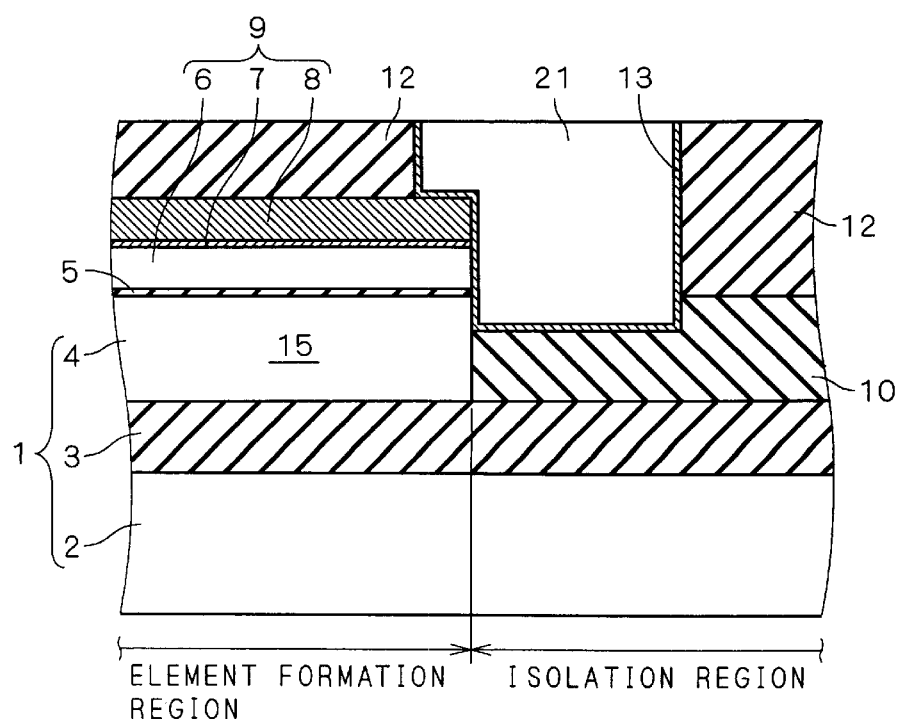
FIG. 20 is a cross section showing a first variation of the DTMOSFET in accordance with the second preferred embodiment of the present invention.

FIG. 20 is a cross section showing the first variation of the DTMOSFET in accordance with the second preferred embodiment of the present invention, corresponding to FIG. 19. Instead of the tungsten plug 14, the $p^+$-type doped polysilicon plug 21 is formed. The structure other than this is the same as that shown in FIG. 2. In this case, the barrier film 13 interposed between the doped polysilicon plug 21 and the body region 15 can suppress the thermal diffusion of the dopant contained in the doped polysilicon plug 21 into the body region 15.

Figure 21:
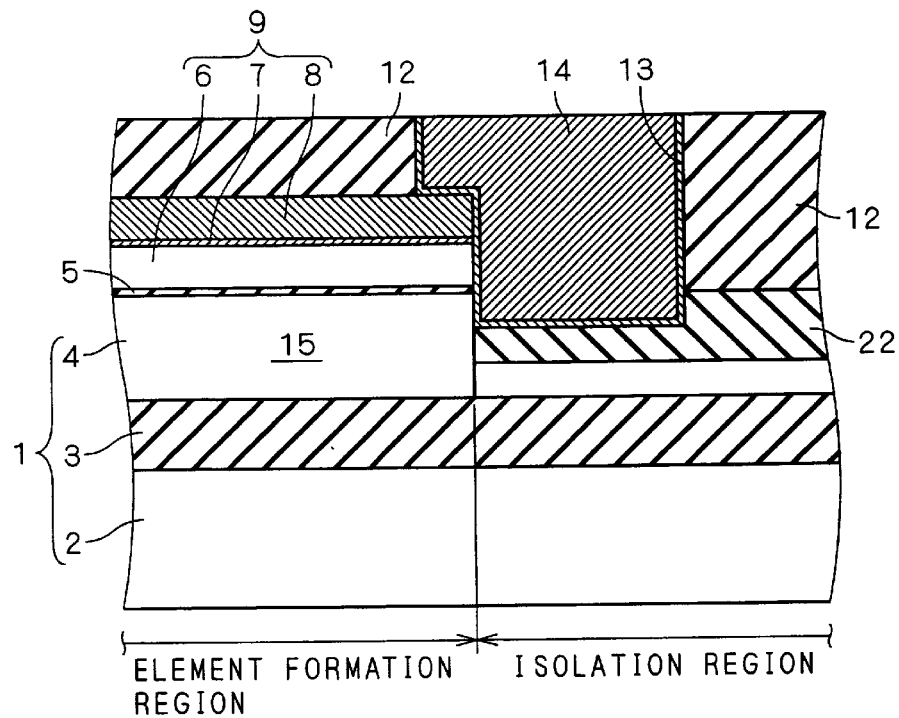
FIG. 21 is a cross section showing a second variation of the DTMOSFET in accordance with the second preferred embodiment of the present invention.

FIG. 21 is a cross section showing the second variation of the DTMOSFET in accordance with the second preferred embodiment of the present invention, corresponding to FIG. 19. Instead of the STI 10 extending from the upper surface of the silicon layer 4 to the upper surface of the BOX layer 3, the STI 22 whose bottom surface does not reach the upper surface of the BOX layer 3 is formed. The structure other than this is the same as that shown in FIG. 19. This structure using the STI 22 can be applied to the DTMOSFET of FIG. 20.

Figure 22:
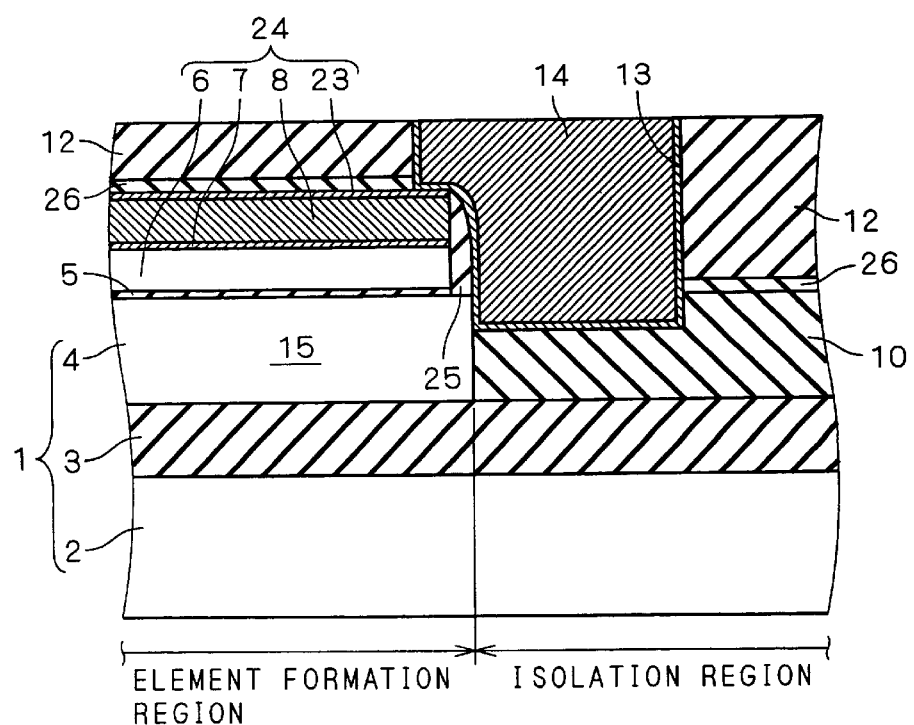
FIG. 22 is a cross section showing a third variation of the DTMOSFET in accordance with the second preferred embodiment of the present invention.

FIG. 22 is a cross section showing the third variation of the DTMOSFET in accordance with the second preferred embodiment of the present invention, corresponding to FIG. 19. The gate electrode 24 has a multilayered structure in which the doped polysilicon layer 6, the tungsten nitride layer 7, the tungsten layer 8 and the barrier layer 23 are layered on the gate oxide film 5 in this order. On the side surface of the gate electrode 24, the sidewall 25 is formed.

On the gate electrode 24, the silicon nitride film 26 is formed. Above the gate electrode 24, the interlayer insulating film 12 made of silicon oxide is formed on the silicon nitride film 26. Further, on the upper surface of the STI 10 in a portion where no tungsten plug 14 is formed, the silicon nitride film 26 is formed. Above the STI 10 in the portion, the interlayer insulating film 12 made of silicon oxide is formed on the silicon nitride film 26. The structure other than this is the same as that shown in FIG. 19.

The Third Preferred Embodiment

Figure 23:
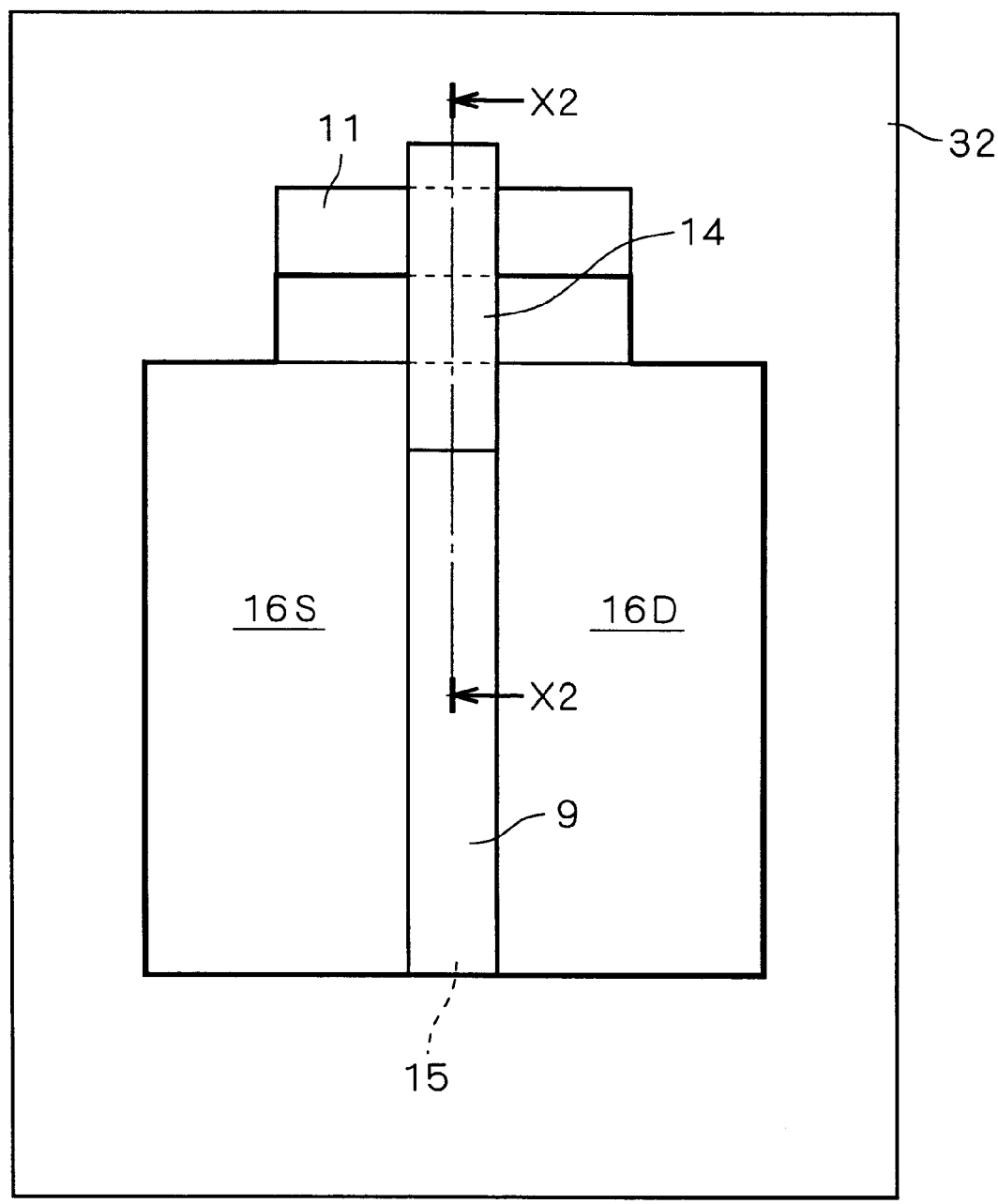
FIG. 23 is a plan view schematically showing a structure of a DTMOSFET in accordance with a third preferred embodiment of the present invention.

FIG. 23 is a plan view schematically showing a structure of a DTMOSFET in accordance with the third preferred embodiment of the present invention, and FIG. 24 is a cross section showing a cross-sectional structure taken along the line X2 of FIG. 23. Referring to FIG. 24, the impurity diffusion region 11 is formed, spreading across the element formation region and the isolation region at their boundary portion in the SOI substrate 1. Thus, in the DTMOSFET of the third preferred embodiment, part of the impurity diffusion region 11 is formed inside the isolation region. In other words, part of the bottom surface of the connection body consisting of the barrier film 13, the tungsten plug 14 and the impurity diffusion region 11 two-dimensionally overlaps the STI 10. The body region 15 is formed, extending from below the gate electrode 9, between part of the bottom surface of the impurity diffusion region 11 which is formed in the element formation region and the upper surface of the BOX layer 3. The structure of the DTMOSFET of the third preferred embodiment other than this is the same as that of the DTMOSFET of the first preferred embodiment shown in FIG. 2.

Referring to FIG. 23, an STI 32 is formed around the source region 16S, the drain region 16D, the body region 15 and part of the impurity diffusion region 11 with the bold line of the figure as a boundary. In other words, the bold line of the figure represents a boundary between the isolation region and the element formation region.

Figure 25:
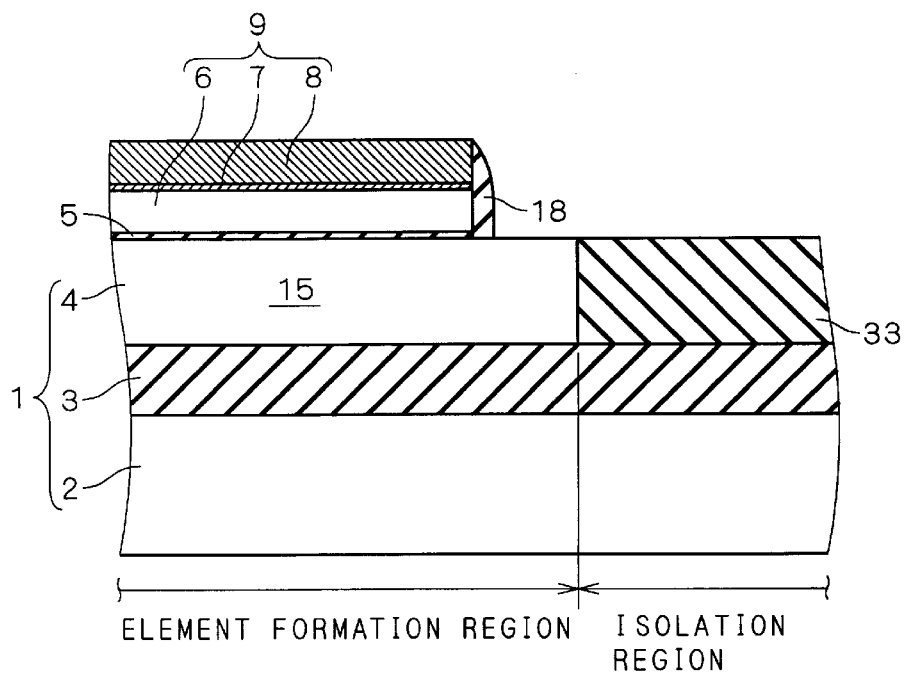
FIGS. 25 to 27 are cross sections showing a method of manufacturing the DTMOSFET of FIG. 24 step by step.
Figure 26:
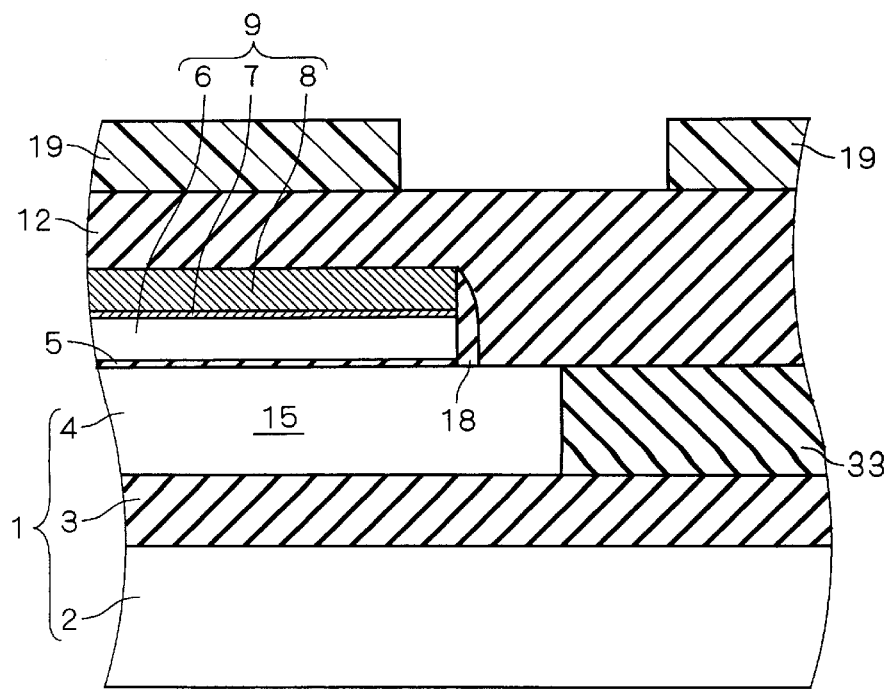
Figure 27:
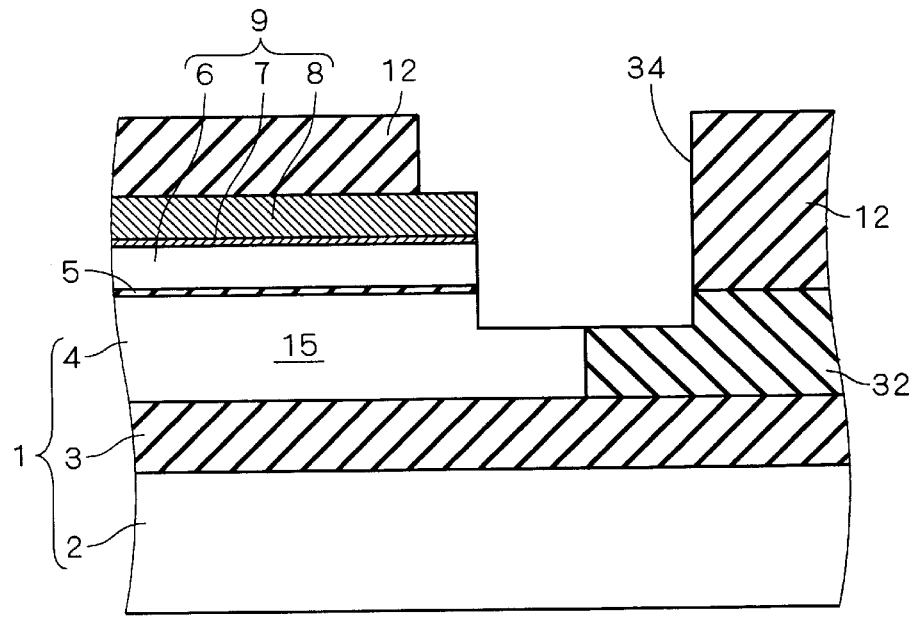

FIGS. 25 to 27 are cross sections showing a method of manufacturing the DTMOSFET of FIG. 24 step by step. Referring to FIG. 25, first, an STI 33 is formed in the silicon layer 4 in the isolation region, and then the body region 15 is formed in the silicon layer 4 in the element formation region. Next, the gate oxide film 5 and the gate electrode 9 are formed on the body region 15 in this order with a predetermined space away from the boundary between the element formation region and the isolation region.

Next, the $n^-$-type impurity region (not shown) is formed shallowly in the upper surface of the silicon layer 4 by the ion implantation method using the gate electrode 9 as an implantation mask. Subsequently, the sidewall 18 made of silicon oxide is formed on the side surface of the gate electrode 9 by the CVD method and the anisotropic dry etching method. The $n^+$-type impurity region (not shown) is formed deeply in the upper surface of the silicon layer 4 by the ion implantation method using the gate electrode 9 and the sidewall 18 as an implantation mask. This forms the source region 16S and the drain region 16D made of the $n^-$-type impurity region and the $n^+$-type impurity region (not shown in FIG. 25).

Referring to FIG. 26, the interlayer insulating film 12 made of silicon oxide is entirely formed on the structure of FIG. 25. Next, the photoresist 19 having a predetermined opening pattern is formed on the interlayer insulating film 12.

Referring to FIG. 27, using the photoresist 19 as an etching mask, the interlayer insulating film 12, the sidewall 18, part of the upper surface of the STI 32 and part of the upper surface of the silicon layer 4 are etched by the anisotropic dry etching method with high etching rate in the depth direction of the SOI substrate 1. This selectively forms a recess 34 in the interlayer insulating film 12 and the silicon layer 4. After that, the photoresist 19 is removed.

Next, the impurity diffusion region 11 whose upper surface is even with that of the STI 32 in level is formed on a bottom surface of the recess 34 by the epitaxial growth method. After the barrier film 13 and the tungsten plug 14 are entirely formed in this order, an etchback is performed, to obtain the structure of FIG. 24.

In the DTMOSFET of the third preferred embodiment, as compared with that of the first preferred embodiment shown in FIG. 2, the contact area between the impurity diffusion region 11 and the body region 15 is wider and therefore the contact resistance between the impurity diffusion region 11 and the body region 15 can be reduced. As a result, it is possible to strengthen the electrical connection between the gate electrode 9 and the body region 15.

Figure 51:
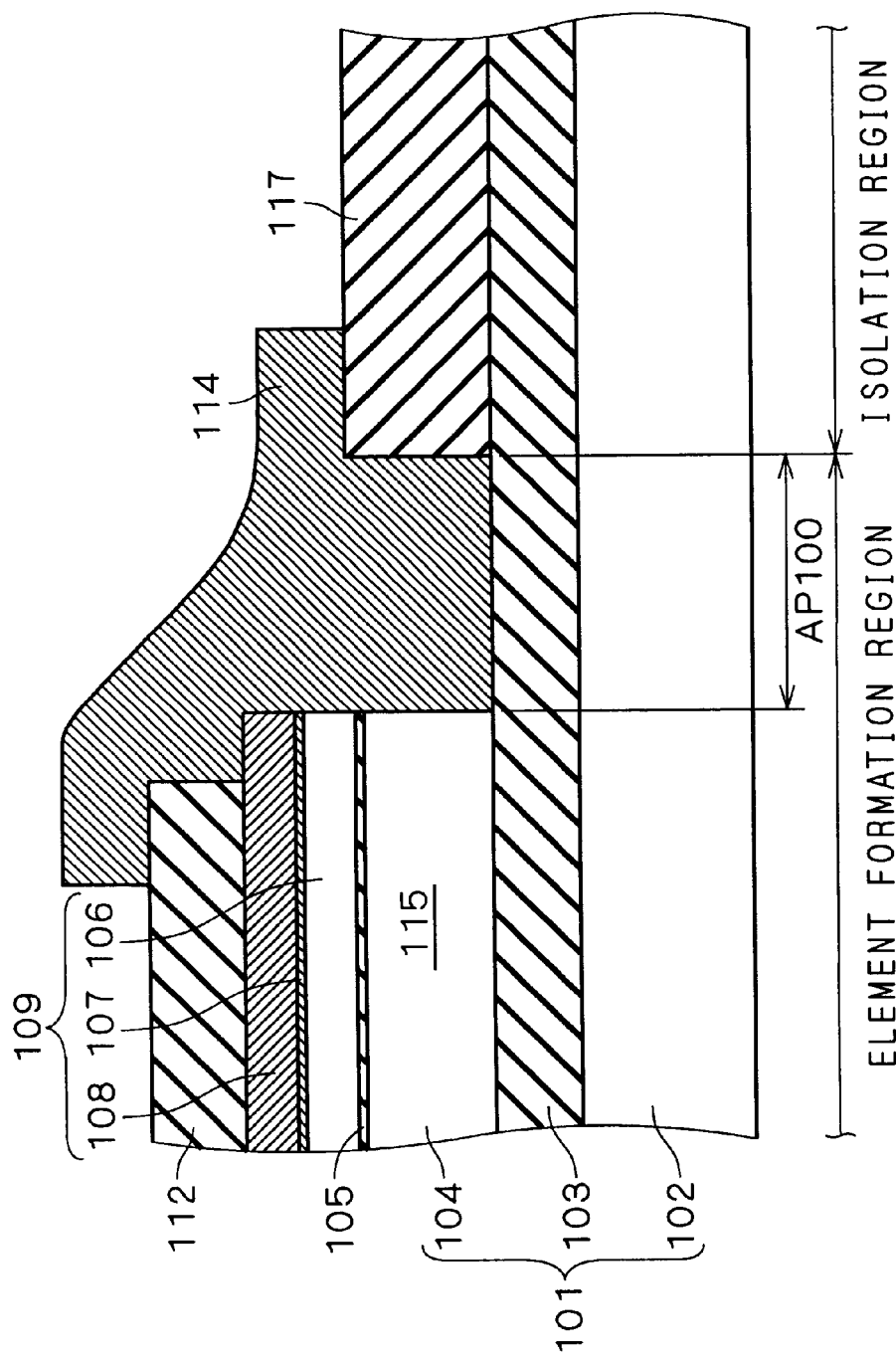
FIG. 51 is a cross section showing a structure of another DTMOSFET of the background art.
Figure 52:
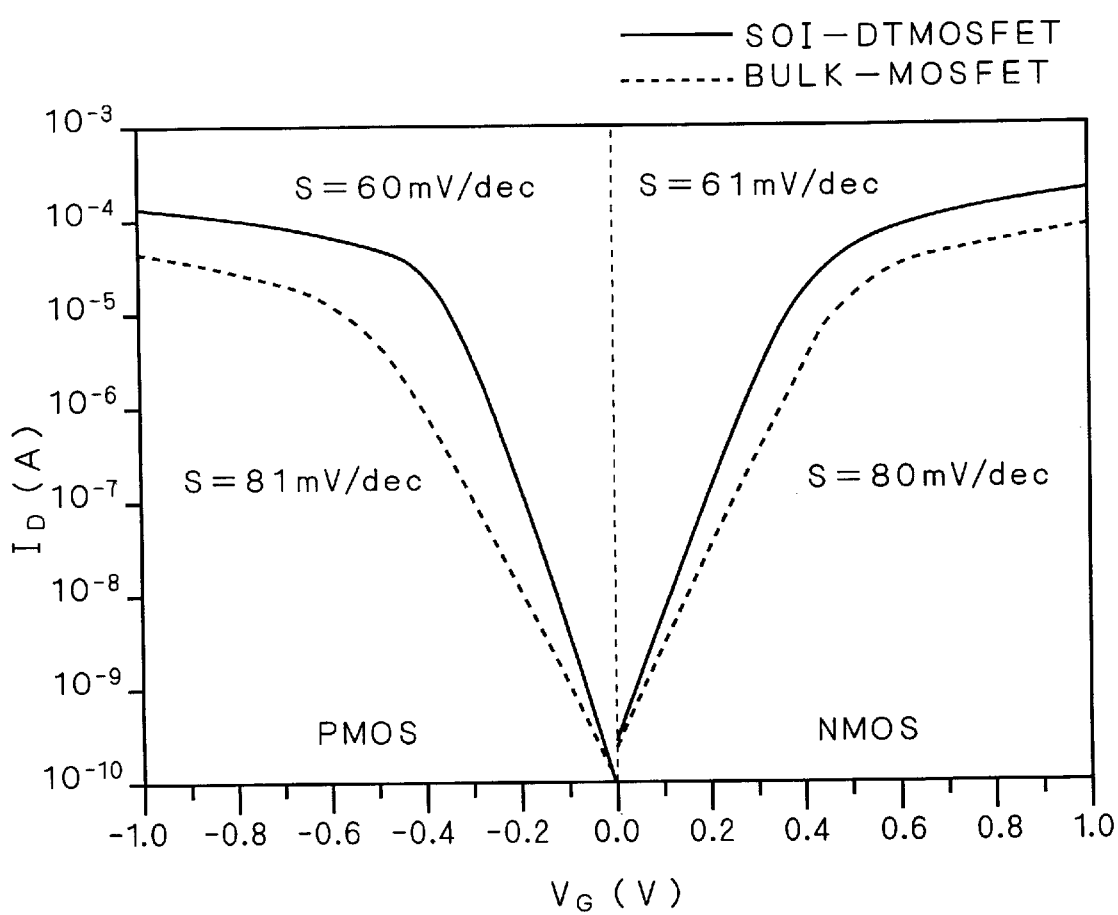
FIG. 52 is a graph showing subthreshold characteristics of a MOSFET.
Figure 53:
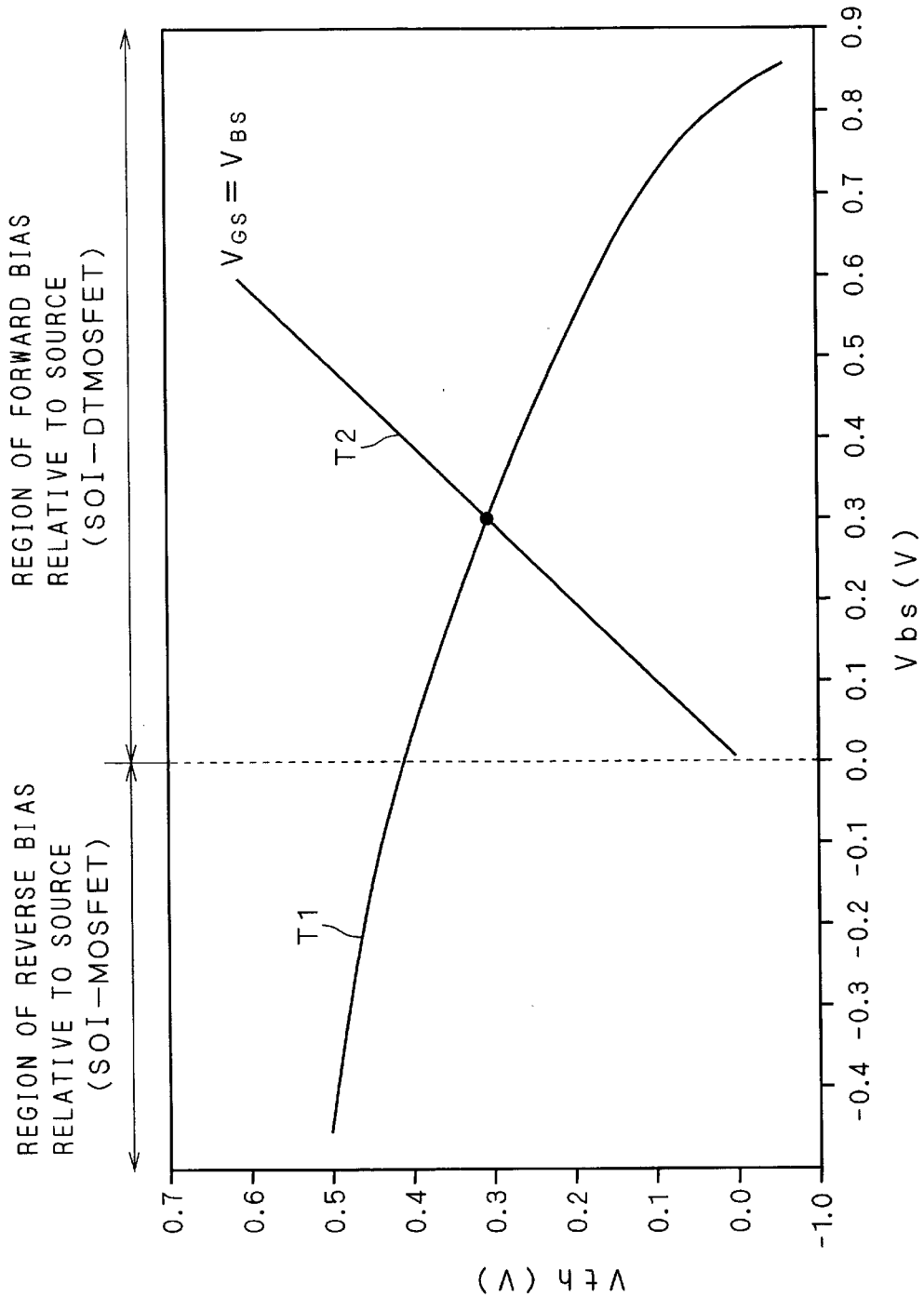
FIG. 53 is a graph showing a relation between a body bias voltage $V_{bs}$ and a threshold voltage $V_{th}$.

Moreover, since part of the impurity diffusion region 11 is formed in the isolation region, it is possible to suppress generation of an area penalty AP1, which is generated when the impurity diffusion region 11 is formed in the element formation region, more than the area penalty AP100 in the background-art DTMOSFET shown in FIGS. 50 and 51. As a result, the chip area can be reduced as compared with the background-art DTMOSFET.

Figure 28:
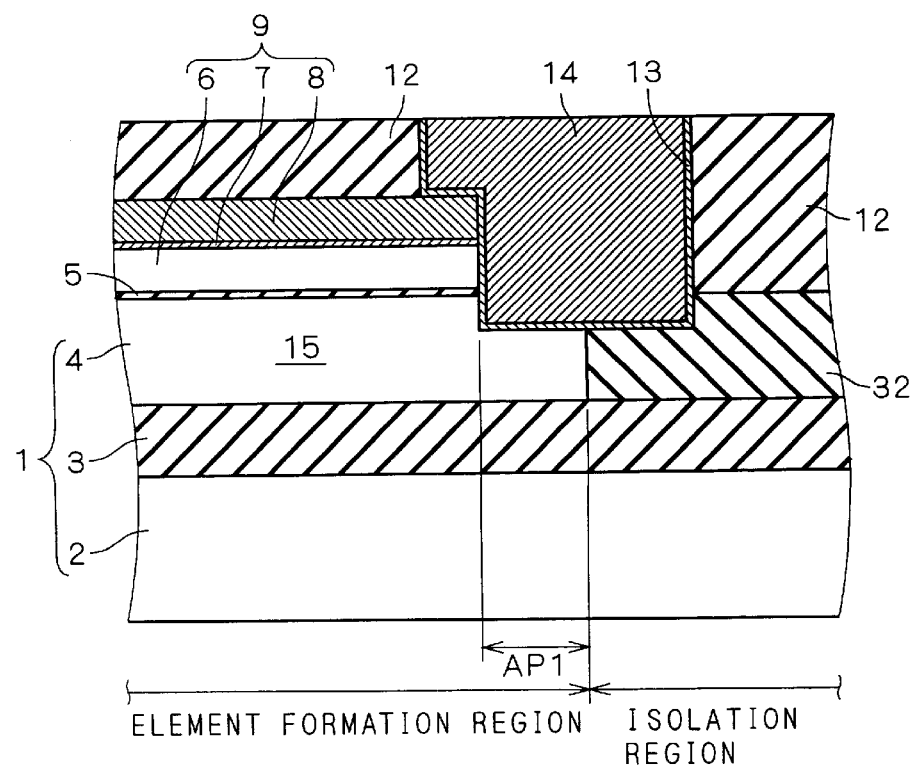
FIG. 28 is a cross section showing a first variation of the DTMOSFET in accordance with the third preferred embodiment of the present invention.

FIG. 28 is a cross section showing the first variation of the DTMOSFET in accordance with the third preferred embodiment of the present invention, corresponding to FIG. 24.

Like in the DTMOSFET of the second preferred embodiment, instead of the impurity diffusion region 11, a contact hole extending from the upper surface of the interlayer insulating film 12 to the upper surface of the STI 10 is formed and filled with the barrier film 13 and the tungsten plug 14. The structure other than this is the same as that shown in FIG. 24.

Figure 29:
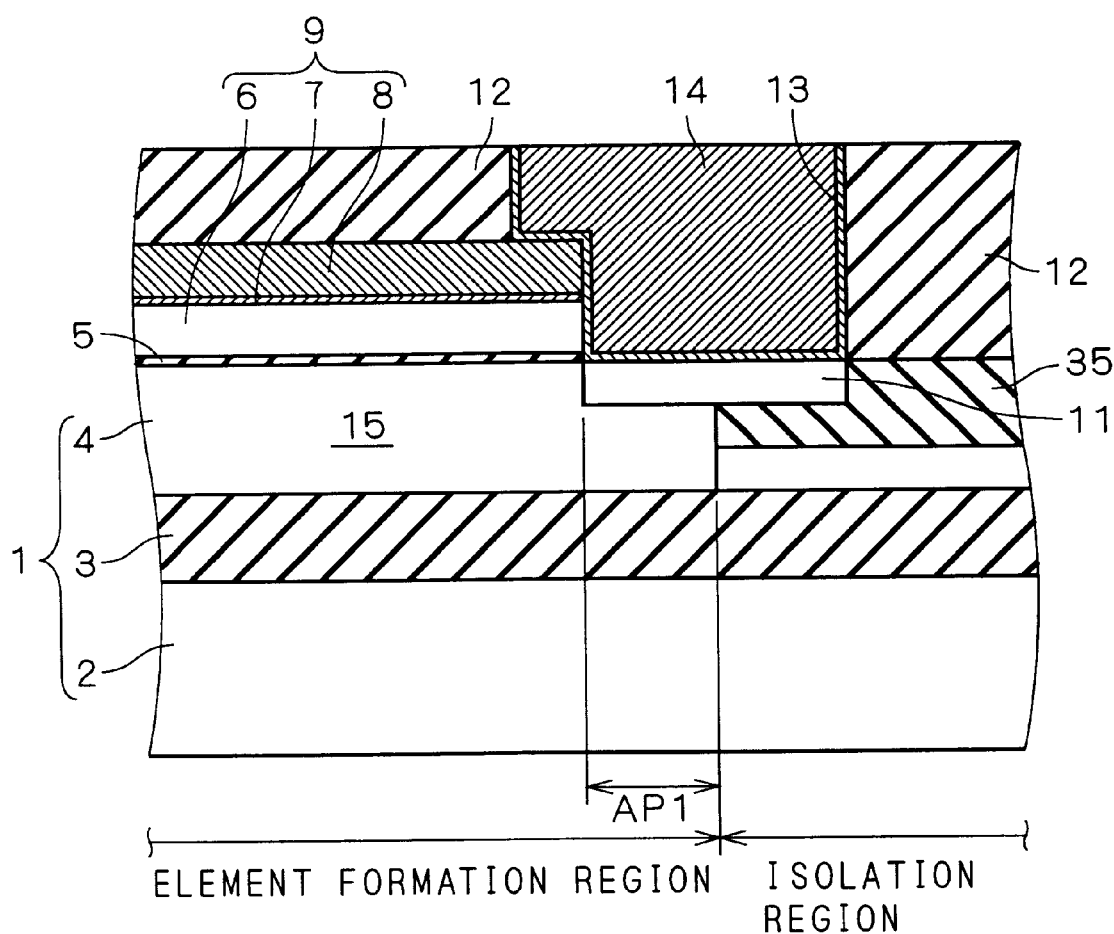
FIG. 29 is a cross section showing a second variation of the DTMOSFET in accordance with the third preferred embodiment of the present invention.

FIG. 29 is a cross section showing the second variation of the DTMOSFET in accordance with the third preferred embodiment of the present invention, corresponding to FIG. 24. Instead of the STI 32 extending from the upper surface of the silicon layer 4 to the upper surface of the BOX layer 3, an STI 35 whose bottom surface does not reach the upper surface of the BOX layer 3 is formed. The structure other than this is the same as that shown in FIG. 24.

Figure 30:
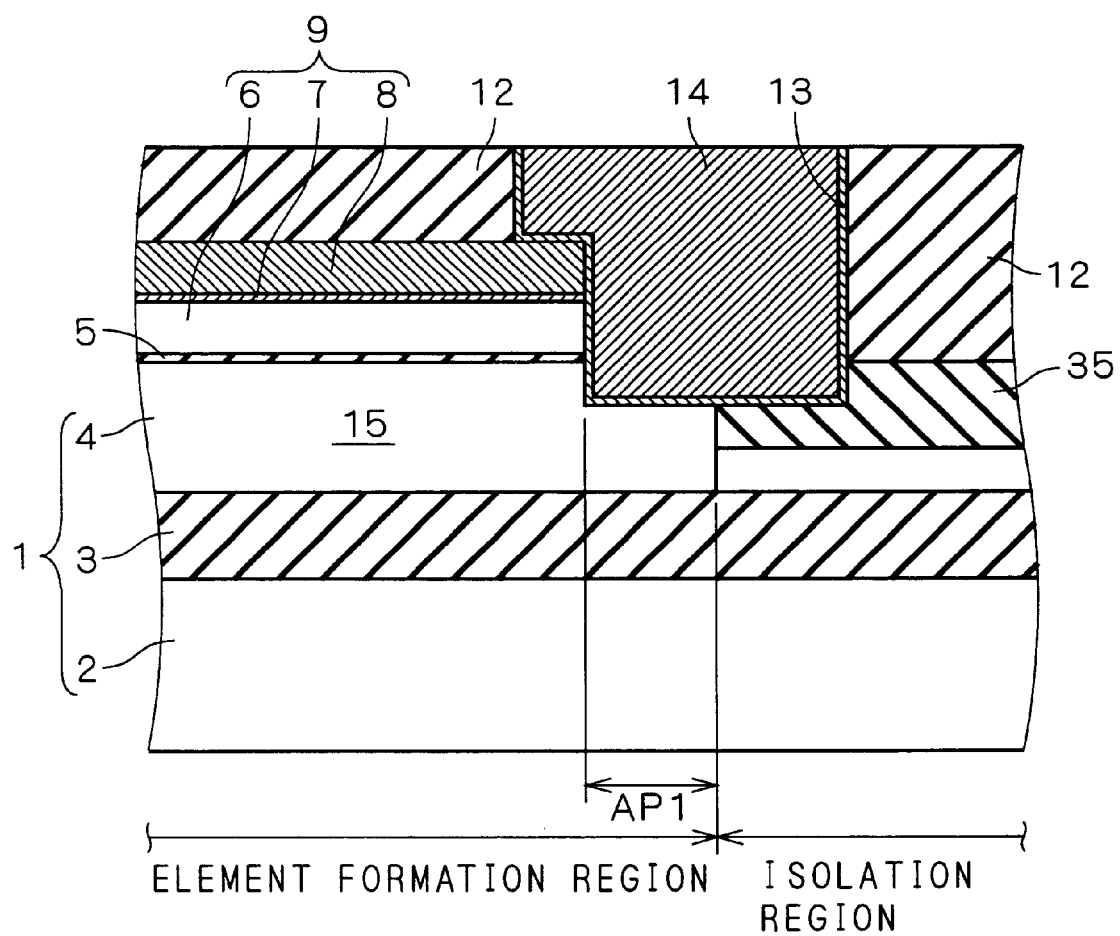
FIG. 30 is a cross section showing a third variation of the DTMOSFET in accordance with the third preferred embodiment of the present invention.

FIG. 30 is a cross section showing the third variation of the DTMOSFET in accordance with the third preferred embodiment of the present invention, corresponding to FIG. 24. The STI 35 of FIG. 29 is used in the DTMOSFET of FIG. 28. The structure other than this is the same as that shown in FIG. 24.

Figure 31:
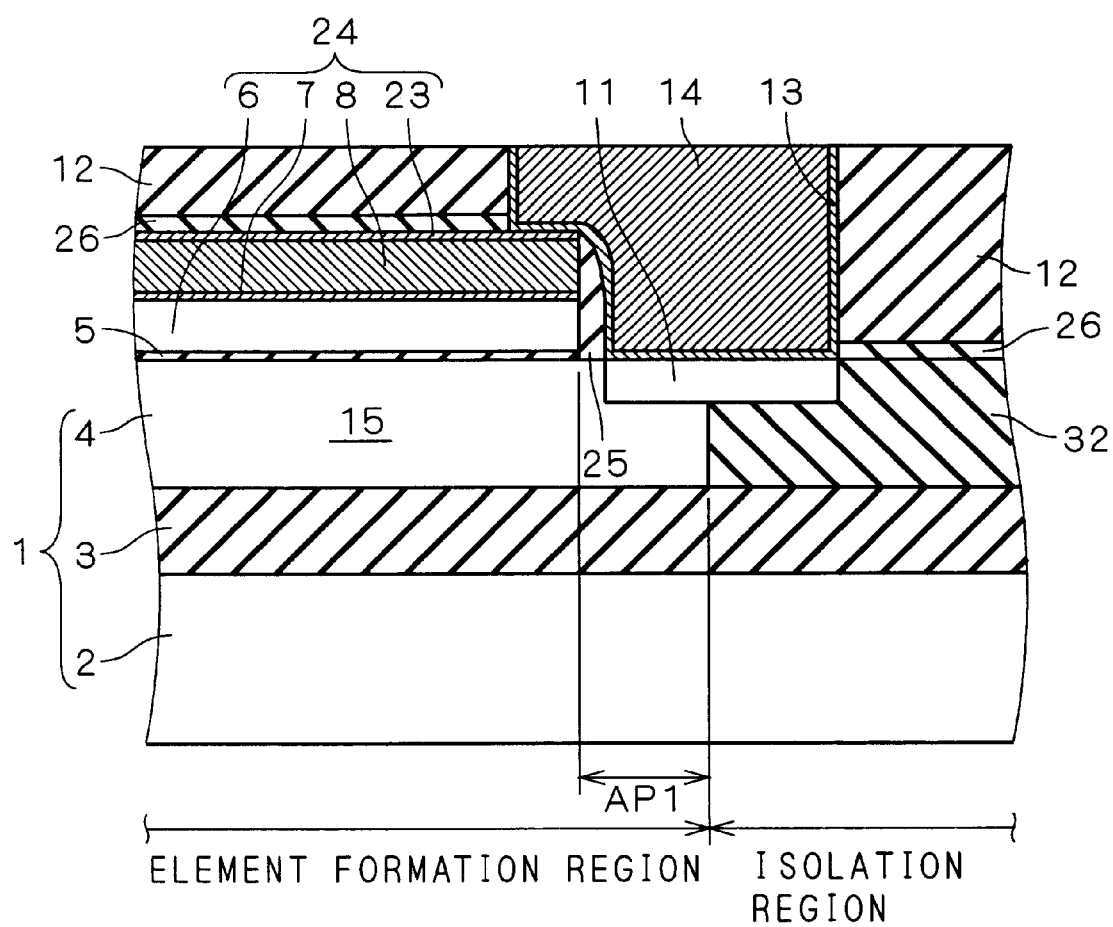
FIG. 31 is a cross section showing a fourth variation of the DTMOSFET in accordance with the third preferred embodiment of the present invention.

FIG. 31 is a cross section showing the fourth variation of the DTMOSFET in accordance with the third preferred embodiment of the present invention, corresponding to FIG. 24. The gate electrode 24 has a multilayered structure in which the doped polysilicon layer 6, the tungsten nitride layer 7, the tungsten layer 8 and the barrier layer 23 are layered on the gate oxide film 5 in this order. On the side surface of the gate electrode 24, the sidewall 25 is formed. On the gate electrode 24, the silicon nitride film 26 is formed. Above the gate electrode 24, the interlayer insulating film 12 made of silicon oxide is formed on the silicon nitride film 26. Further, on an upper surface of the STI 32 in a portion where no tungsten plug 14 is formed, the silicon nitride film 26 is formed. Above the STI 32 in the portion, the interlayer insulating film 12 is formed on the silicon nitride film 26. The structure other than this is the same as that shown in FIG. 24.

FIG. 32 is a cross section showing the fifth variation of the DTMOSFET in accordance with the third preferred embodiment of the present invention, corresponding to FIG. 24. Instead of the STI 32 having the upper surface in which the impurity diffusion region 11 is formed, the STI 33 is formed, having an upper surface in which no impurity diffusion region 11 is formed. Further, instead of the impurity diffusion region 11 formed in the upper surface of the silicon layer 4, a p$^+$-type impurity diffusion region 36 extending from the upper surface of the silicon layer 4 to the upper surface of the BOX layer 3 is formed. The tungsten plug 14 is formed, spreading across the element formation region and the isolation region, and the bottom surface of the tungsten plug 14 is in contact with an upper surface of the impurity diffusion region 36 with the barrier film 13 interposed therebetween in the element formation region and in contact with an upper surface of the STI 33 with the barrier film 13 interposed therebetween in the isolation region. Furthermore, a side surface of the impurity diffusion region 36 on the side opposite to where it is in contact with the STI 33 is entirely in contact with the side surface of the body region 15.

The Fourth Preferred Embodiment

FIG. 33 is a cross section showing a structure of a DTMOSFET in accordance with the fourth preferred embodiment of the present invention, corresponding to FIG. 2. A p$^+$-type impurity diffusion region 41 is formed, spreading across the element formation region and the isolation region at their boundary portion on the SOI substrate 1. In other words, part of the impurity diffusion region 41 is formed in the isolation region. A bottom surface of the impurity diffusion region 41 is in contact with the upper surface of the body region 15 in the element formation region and in contact with the upper surface of the STI 33 in the isolation region. Further, an upper surface of the impurity diffusion region 41 is in contact with the tungsten plug 14 with the barrier film 13 interposed therebetween. In other words, part of the bottom surface of the connection body consisting of the barrier film 13, the tungsten plug 14 and the impurity diffusion region 41 two-dimensionally overlaps the STI 33 in the DTMOSFET of the fourth preferred embodiment.

The gate electrode 24 has a multilayered structure in which the n$^+$-type doped polysilicon layer 6, the tungsten nitride layer 7, the tungsten layer 8 and the barrier layer 23 are layered on the gate oxide film 5 in this order. On the side surface of the gate electrode 24, the sidewall 25 is formed. On the gate electrode 24, the silicon nitride film 26 is formed. Above the gate electrode 24, the interlayer insulating film 12 made of silicon oxide is formed on the silicon nitride film 26. Further, on an upper surface of the STI 33 in a portion where no impurity diffusion region 41 is formed, the silicon nitride film 26 is formed. Above the STI 33 in the portion, the interlayer insulating film 12 is formed on the silicon nitride film 26. The structure of the DTMOSFET of the fourth preferred embodiment other than this is the same as that of the DTMOSFET of the first preferred embodiment shown in FIG. 2.

Figure 34:
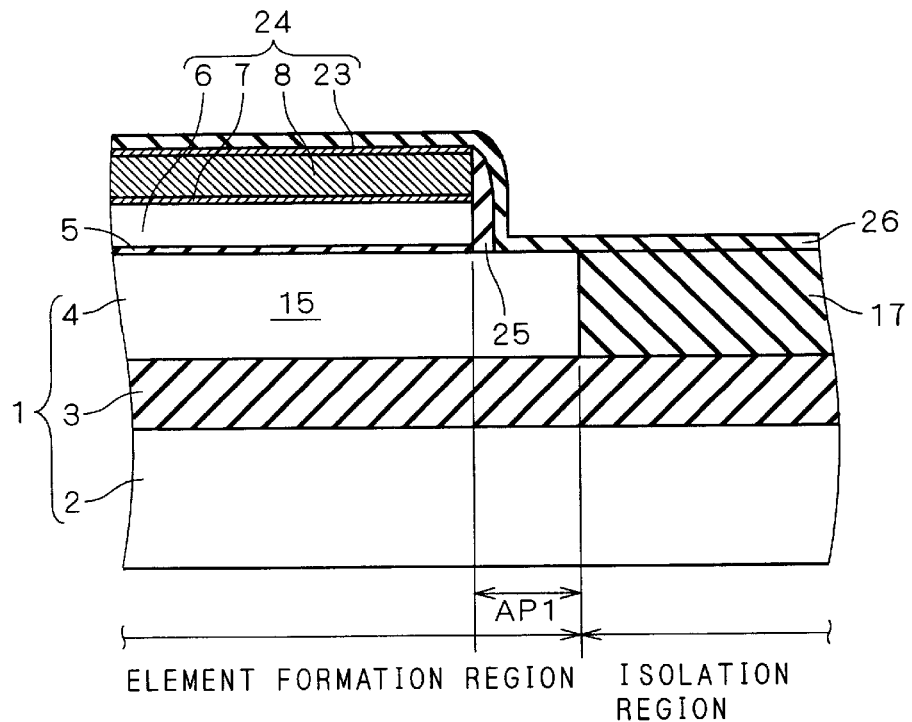

FIGS. 34 to 37 are cross sections showing a method of manufacturing the DTMOSFET of FIG. 33 step by step. Referring to FIG. 34, first, the STI 33 is formed in the silicon layer 4 in the isolation region, and then the body region 15 is formed in the silicon layer 4 in the element formation region. Next, the gate oxide film 5 and the gate electrode 24 are formed on the body region 15 in this order with a predetermined space away from the boundary between the element formation region and the isolation region.

Next, the n$^-$-type impurity region (not shown) is formed shallowly in the upper surface of the silicon layer 4 by the ion implantation method using the gate electrode 24 as an implantation mask. Subsequently, the sidewall 25 made of silicon nitride is formed on the side surface of the gate electrode 24 by the CVD method and the anisotropic dry etching method. Then, the n$^+$-type impurity region (not shown) is formed deeply in the upper surface of the silicon layer 4 by the ion implantation method using the gate electrode 24 and the sidewall 25 as an implantation mask. This forms the source region 16S and the drain region 16D made of the n$^-$-type impurity region and the n$^+$-type impurity region (not shown in FIG. 34). Then, the silicon nitride film 26 is entirely formed by the CVD method.

Figure 35:
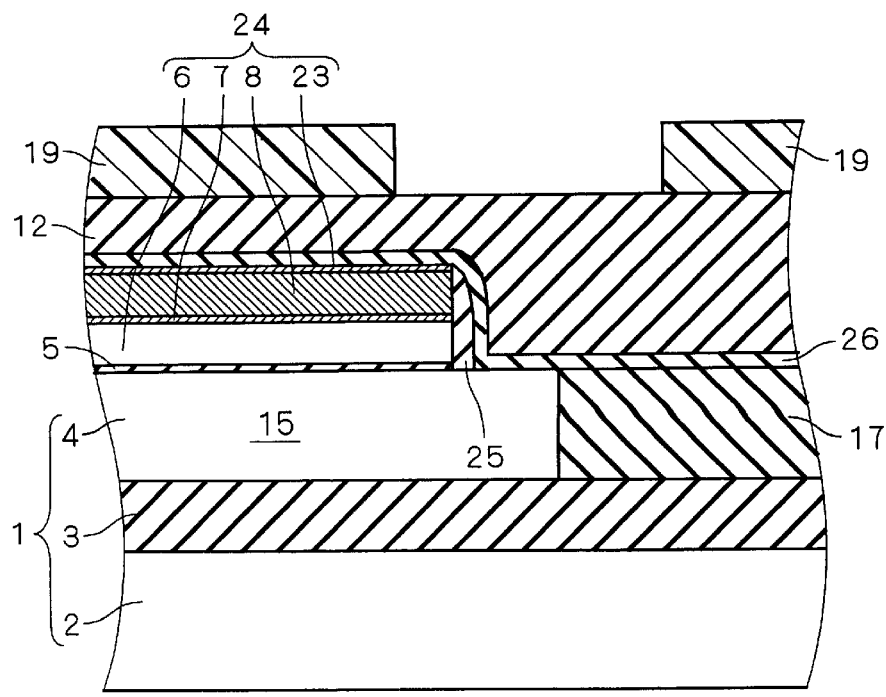

Referring to FIG. 35, the interlayer insulating film 12 made of silicon oxide is entirely formed on the structure of FIG. 34. Next, the photoresist 19 having a predetermined opening pattern is formed on the interlayer insulating film 12.

Referring to FIG. 36, using the photoresist 19 as an etching mask, the interlayer insulating film 12 is etched by the anisotropic dry etching method with high etching rate in the depth direction of the SOI substrate 1 and etch selectivity to the silicon oxide. This exposes the silicon nitride film 26.

Next, the exposed silicon nitride film 26 is removed by etching. This exposes part of the upper surface of the gate electrode 24, the sidewall 25, part of the upper surface of the body region 15 and part of the upper surface of the STI 33. After that, the photoresist 19 is removed.

Referring to FIG. 37, the silicon is epitaxially grown, using the silicon of the body region 15 as a seed crystal, to form the impurity diffusion region 41 having a predetermined thickness on the body region 15 and the STI 33. The impurity diffusion region 41 may be formed by the CVD method. Next, the barrier film 13 and the tungsten plug 14 are entirely formed in this order, and then an etchback is performed, to obtain the structure of FIG. 33. Further, there may be a case where the barrier film 13 and the tungsten plug 14 are formed after the structure of FIG. 36 is obtained, omitting the process of forming the impurity diffusion region 41.

In the DTMOSFET of the fourth preferred embodiment, since part of the impurity diffusion region 41 is formed in the isolation region, it is possible to suppress generation of the area penalty AP1, which is generated when the impurity diffusion region 41 is formed in the element formation region, more than the area penalty AP100 in the background-art DTMOSFET shown in FIGS. 50 and 51. As a result, the chip area can be reduced as compared with the background-art DTMOSFET.

Moreover, the sidewall 25 made of insulating film is formed between the n⁺-type doped polysilicon layer 6 included in the gate electrode 24 and the p⁺-type impurity diffusion region 41 formed on the SOI substrate 1. Therefore, it is possible to avoid formation of the pn junction between the doped polysilicon layer 6 and the impurity diffusion region 41.

Figure 38:
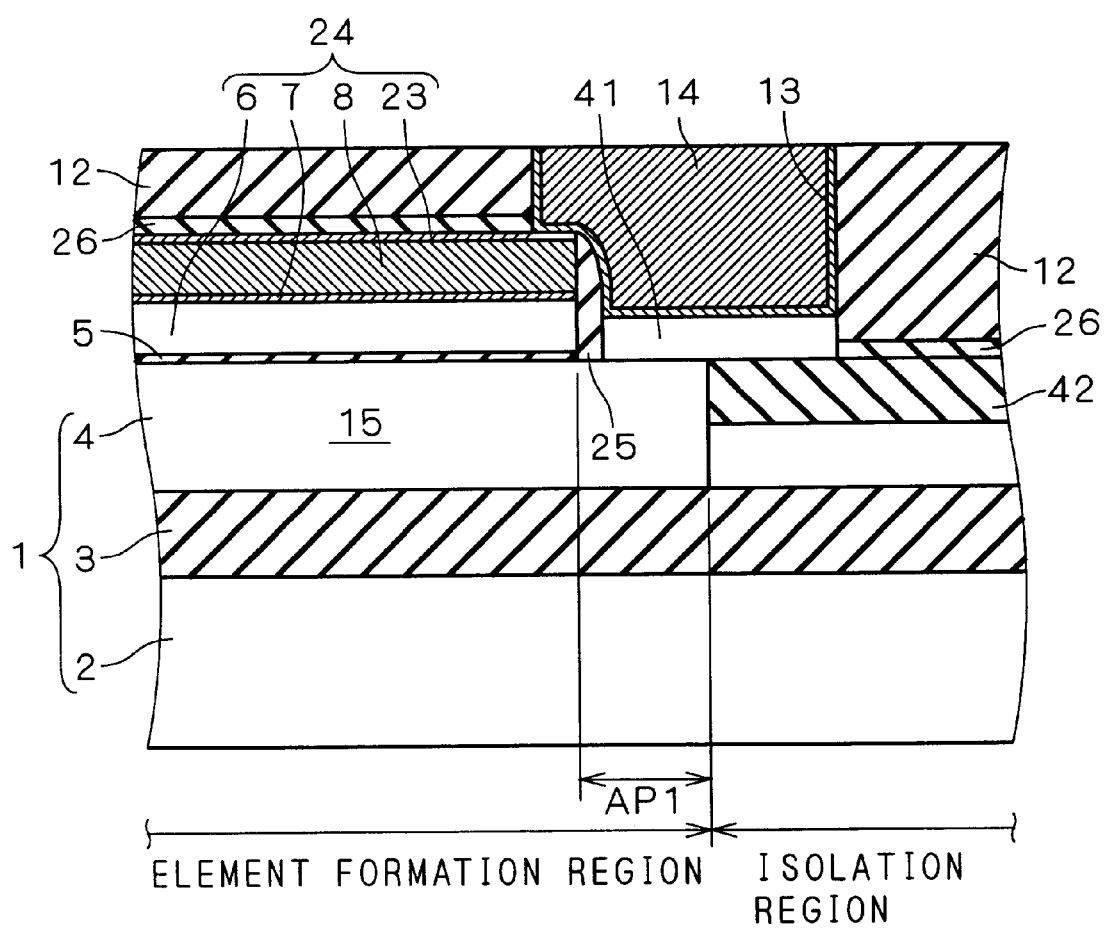
FIG. 38 is a cross section showing a variation of the DTMOSFET in accordance with the fourth preferred embodiment of the present invention.

FIG. 38 is a cross section showing a variation of the DTMOSFET in accordance with the fourth preferred embodiment of the present invention, corresponding to FIG. 33. Instead of the STI 33 extending from the upper surface of the silicon layer 4 to the upper surface of the BOX layer 3, an STI 42 whose bottom surface does not reach the upper surface of the BOX layer 3 is formed. The structure other than this is the same as that shown in FIG. 33.

The Fifth Preferred Embodiment

Figure 39:
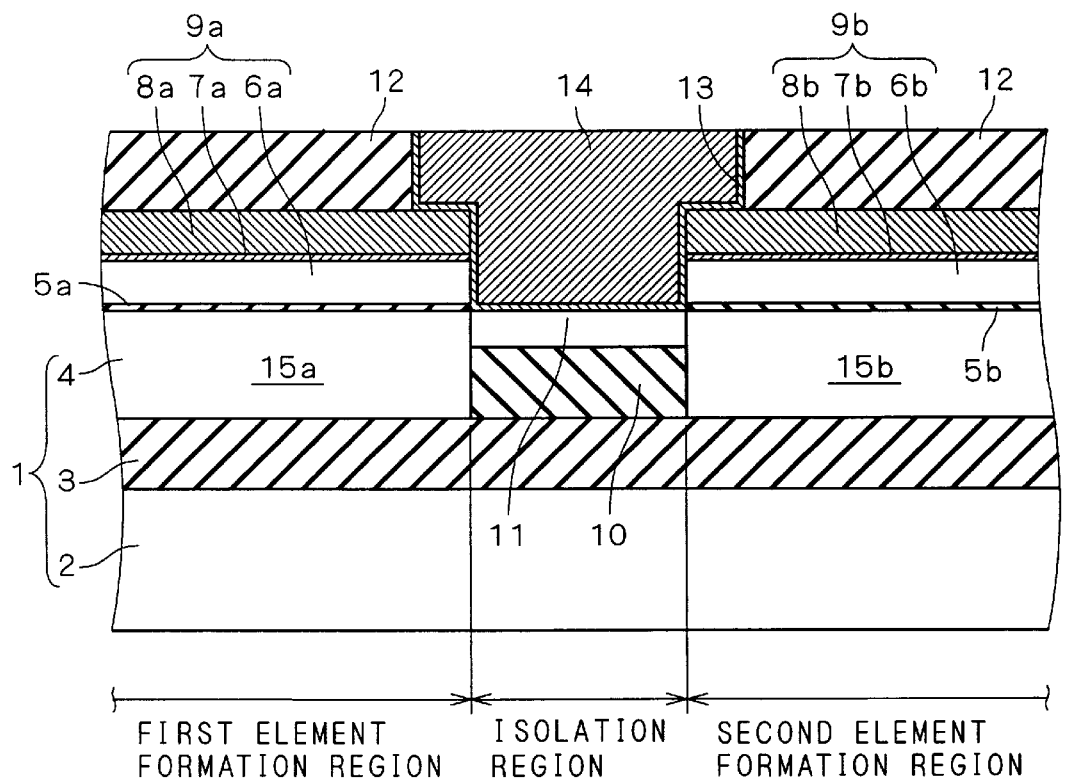
FIG. 39 is a cross section showing a structure of a DTMOSFET in accordance with a fifth preferred embodiment of the present invention.

FIG. 39 is a cross section showing a structure of a DTMOSFET in accordance with the fifth preferred embodiment of the present invention. The SOI substrate 1 has first and second element formation regions which sandwich the isolation region. In the first element formation region, a p-type body region 15a is formed in the silicon layer 4. On the body region 15a, a gate electrode 9a is formed with a gate oxide film 5a interposed therebetween. The gate electrode 9a has a multilayered structure in which an n⁺-type doped polysilicon layer 6a, a tungsten nitride layer 7a and a tungsten layer 8a are layered on the gate oxide film 5a in this order. Further, the interlayer insulating film 12 made of silicon oxide is formed on an upper surface of the gate electrode 9a except an end portion on the side adjacent to the isolation region.

In the second element formation region, a p-type body region 15b is formed in the silicon layer 4. On the body region 15b, a gate electrode 9b is formed with a gate oxide film 5b interposed therebetween. The gate electrode 9b has a multilayered structure in which an n⁺-type doped polysilicon layer 6b, a tungsten nitride layer 7b and a tungsten layer 8b are layered on the gate oxide film 5b in this order, like the gate electrode 9a. Further, the interlayer insulating film 12 made of silicon oxide is formed on an upper surface of the gate electrode 9b except an end portion on the side adjacent to the isolation region.

In the isolation region, in the upper surface of the silicon layer 4, the p⁺-type impurity diffusion region 11 is formed.

Further, between the impurity diffusion region 11 and the BOX layer 3, the STI 10 is formed. The impurity diffusion region 11 is in contact with both the body regions 15a and 15b. Inside a recess defined by the interlayer insulating film 12, the gate electrodes 9a and 9b and the impurity diffusion region 11, the tungsten plug 14 is formed with the barrier film 13 interposed therebetween. As a result, the gate electrodes 9a and 9b and the body regions 15a and 15b are electrically connected with the tungsten plug 14 and the barrier film 13 interposed therebetween, respectively.

The relation in conductivity type of the body regions 15a and 15b and the doped polysilicon layers 6a and 6b becomes as above (1) when NMOSFETs of surface channel type are formed in both the first and second element formation regions, (2) when PMOSFETs of buried channel type are formed in both the first and second element formation regions, or (3) when an NMOSFET of surface channel type is formed in one of the first and second element formation regions and a PMOSFET of buried channel type is formed in the other one.

In the case of (3), for example, the MOSFET formed in the first element formation region and the MOSFET formed in the second element formation region can constitute a CMOS inverter circuit. In this case, since a common signal is inputted to respective gates of the NMOSFET and the PMOSFET, a structure in which the gate electrodes 9a and 9b are connected to each other with the tungsten plug 14 and the barrier film 13 interposed therebetween, as shown in FIG. 39, can be used. The CMOS inverter circuit is used for a driver and an SRAM in which a plurality of CMOS inverters are connected in a cross-coupled manner.

Thus, in the DTMOSFET of the fifth preferred embodiment, a plurality of DTMOSFETs which are adjacent to each other with the isolation region share the impurity diffusion region 11, the tungsten plug 14 and the barrier film 13 formed in the isolation region. Therefore, the chip area can be reduced as compared with a case where the impurity diffusion region 11, the tungsten plug 14 and the like are provided in each DTMOSFET.

Further, though the invention of the fifth preferred embodiment is applied to the base DTMOSFET of the first preferred embodiment in the above discussion, the invention of the fifth preferred embodiment may be applied to the base DTMOSFETs of the second to fourth preferred embodiments.

The Sixth Preferred Embodiment

Figure 40:
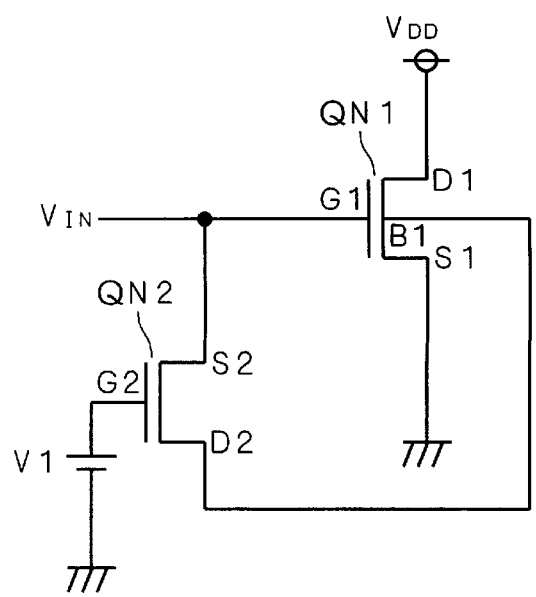
FIG. 40 is a circuit diagram showing an exemplary circuit using a DTMOSFET in accordance with a sixth preferred embodiment of the present invention.

FIG. 40 is a circuit diagram showing an exemplary circuit using a DTMOSFET. A transistor QN1 is a DTMOSFET having a gate G1, a drain D1, a source S1 and a body B1. A transistor QN2 is an enhancement-type or depletion-type MOSFET having a gate G2, a drain D2 and a source S2. The gate G1 and the body B1 of the transistor QN1 are connected to each other with the transistor QN2 interposed therebetween.

Figure 41:
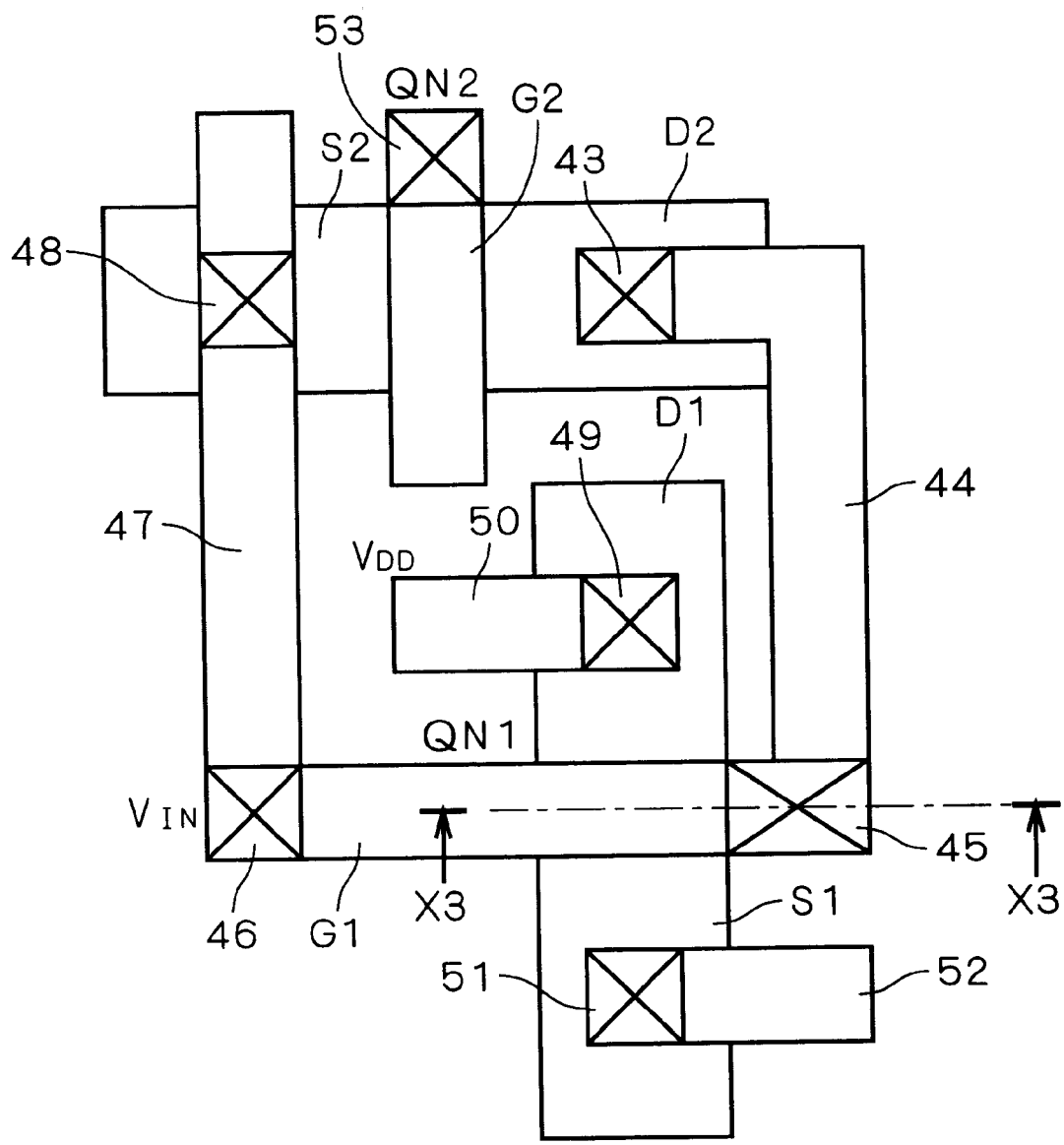
FIG. 41 is a plan view schematically showing a structure of a semiconductor device which is a constituent of the circuit of FIG. 40.

FIG. 41 is a plan view schematically showing a structure of a semiconductor device which is a constituent of the circuit of FIG. 40. The drain D2 of the transistor QN2 is connected to a wire 44 with a contact plug 43 interposed therebetween. The wire 44 is connected to the body BI of the transistor QN1 (not shown in FIG. 41) with a contact plug 45 interposed therebetween. The gate G1 of the transistor QN1 is connected to a wire 47 with a contact plug 46 interposed therebetween. The wire 47 is connected to the source S2 of the transistor QN2 with a contact plug 48 interposed therebetween.

A power-supply potential $V_{DD}$ is inputted to the drain D1 of the transistor QN1 through a wire 50 and a contact plug

49. A ground potential is inputted to the source S1 of the transistor QN1 through a wire 52 and a contact plug 51. A gate voltage V1 is inputted to the gate G2 of the transistor QN2 through a wire (not shown) and a contact plug 53.

Figure 42:
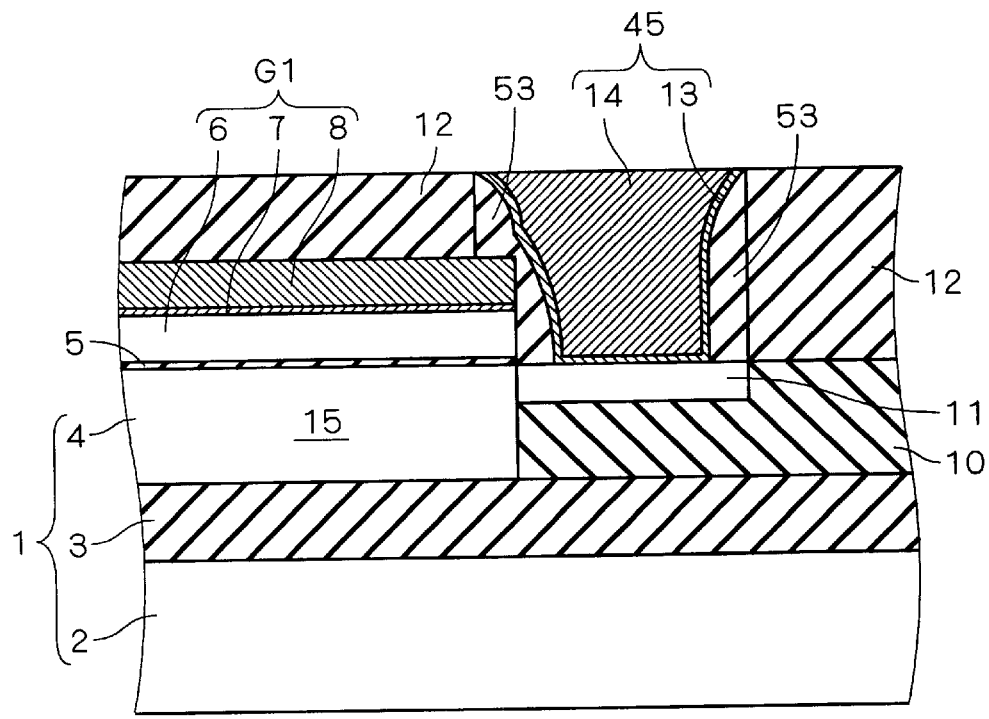
FIG. 42 is a cross section showing a cross-sectional structure of the semiconductor device of FIG. 41.

FIG. 42 is a cross section showing a cross-sectional structure taken along the line X3 of FIG. 41. The gate electrode G1 has a multilayered structure in which the doped polysilicon layer 6, the tungsten nitride layer 7 and the tungsten layer 8 are layered on the gate oxide film 5 in this order. The contact plug 45 is constituted of the barrier film 13 and the tungsten plug 14. In the upper surface of the STI 10, the impurity diffusion region 11 is selectively formed. The side surface of the impurity diffusion region 11 is in contact with the body region 15 (which corresponds to the body B1 of FIG. 40) and the upper surface thereof is in contact with the contact plug 45. Further, to prevent the gate electrode G1 and the contact plug 45 from coming into electrical contact with each other, a sidewall 53 made of insulating film is formed. The sidewall 53 is formed on a side surface of a recess defined by the interlayer insulating film 12, the gate electrode G1 and the impurity diffusion region 11.

Furthermore, though the invention of the sixth preferred embodiment is applied to the base DTMOSFET of the first preferred embodiment in FIG. 42, the invention of the sixth preferred embodiment may be applied to the base DTMOS-FETs of the second to fourth preferred embodiments.

Referring to FIG. 40, if the gate G1 and the body B1 are directly connected to each other, to prevent the parasitic bipolar transistor from being driven, it is necessary to limit an input voltage $V_{IN}$ to the gate G1 of the transistor QN1 to 0.6 V or lower. In contrast, in the sixth preferred embodiment, the gate G1 and the body B1 of the transistor QN1 are connected to each other with the transistor QN2 interposed therebetween. Therefore, by using the transistor QN2 as a transistor for generating a bias voltage, it is possible to control the body voltage to be applied to the body B1 so that it may be limited to 0.6 V or lower. This makes it possible to set the voltage value of the input voltage $V_{IN}$ to 0.6 V or higher and the driving current of the transistor QN1 thereby increases, and therefore the invention can be applied to a clock driver, a buffer and the like.

Further, as shown in FIG. 42, by forming the impurity diffusion region 11 inside the upper surface of the STI 10, it is possible to avoid generation of the area penalty, which is generated when the impurity diffusion region 11 is formed in the element formation region.

Furthermore, to avoid additional power consumption caused by the gate voltage V1 of the transistor QN2, it is desirable to set the characteristics of the transistor QN2 so that the transistor QN2 operates when the gate voltage V1 is 0 V.

Figure 43:
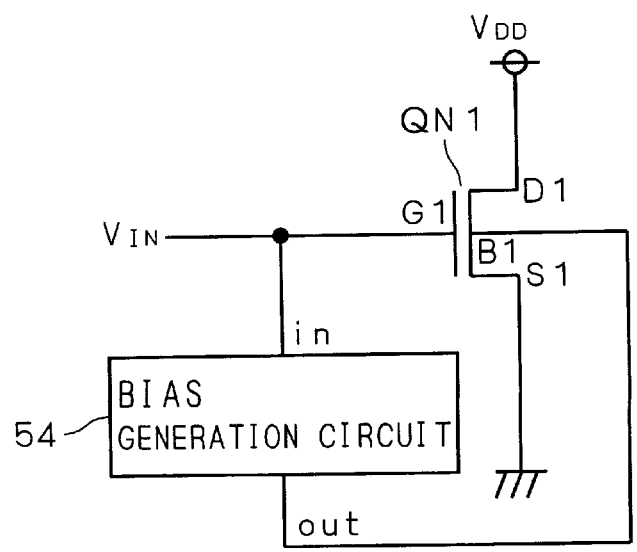
FIG. 43 is a circuit diagram showing a variation of the circuit configuration of FIG. 40.

Though only a single transistor QN2 is connected between the gate G1 and the body B1 of the transistor QN1 as a transistor for generating the bias voltage in FIG. 40, a bias generation circuit 54 constituted of a plurality of transistors may be connected between the gate G1 and the body B1 as shown in FIG. 43.

The Seventh Preferred Embodiment

Figure 44:
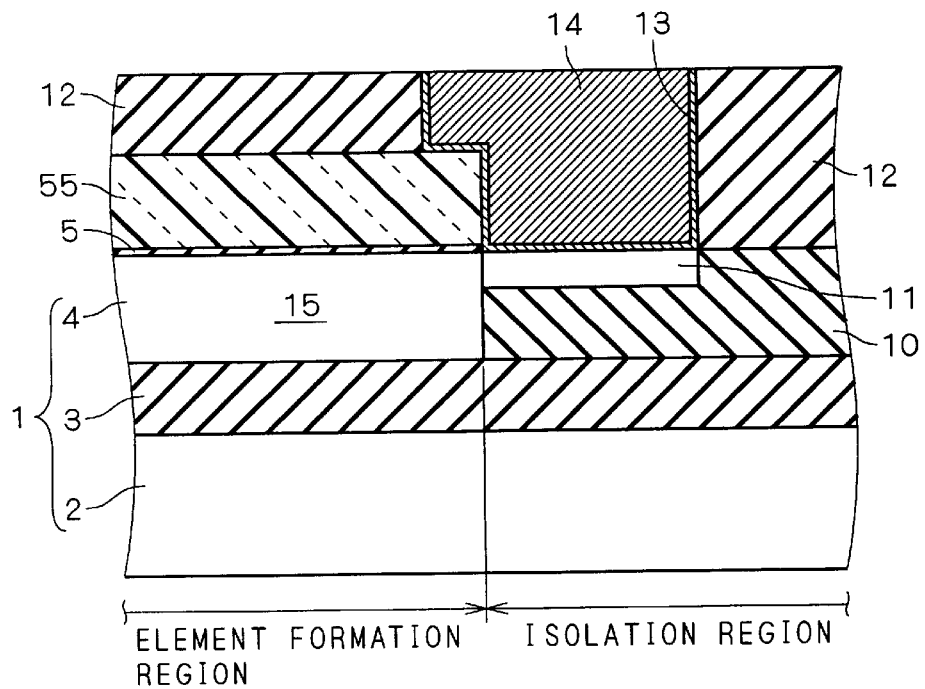
FIG. 44 is a cross section showing a structure of a semiconductor device in accordance with a seventh preferred embodiment of the present invention.

FIG. 44 is a cross section showing a structure of a semiconductor device in accordance with the seventh preferred embodiment of the present invention. The semiconductor device of the seventh preferred embodiment is an improved one of the DTMOSFET of the first preferred embodiment shown in FIG. 2 to be used as a photosensor. Specifically, instead of the gate electrode 9 constituted of the doped polysilicon layer 6, the tungsten nitride layer 7 and the tungsten layer 8, a gate electrode 55 made of a light transmitting material is formed. The gate electrode 55 is in an electrically floating state. The structure of the DTMOS-FET of the seventh preferred embodiment other than this is the same as that of the DTMOSFET of the first preferred embodiment shown in FIG. 2.

Further, though the invention of the seventh preferred embodiment is applied to the base DTMOSFET of the first preferred embodiment in FIG. 44, the invention of the seventh preferred embodiment may be applied to the base DTMOSFETs of the second to fourth preferred embodiments.

Figure 45:
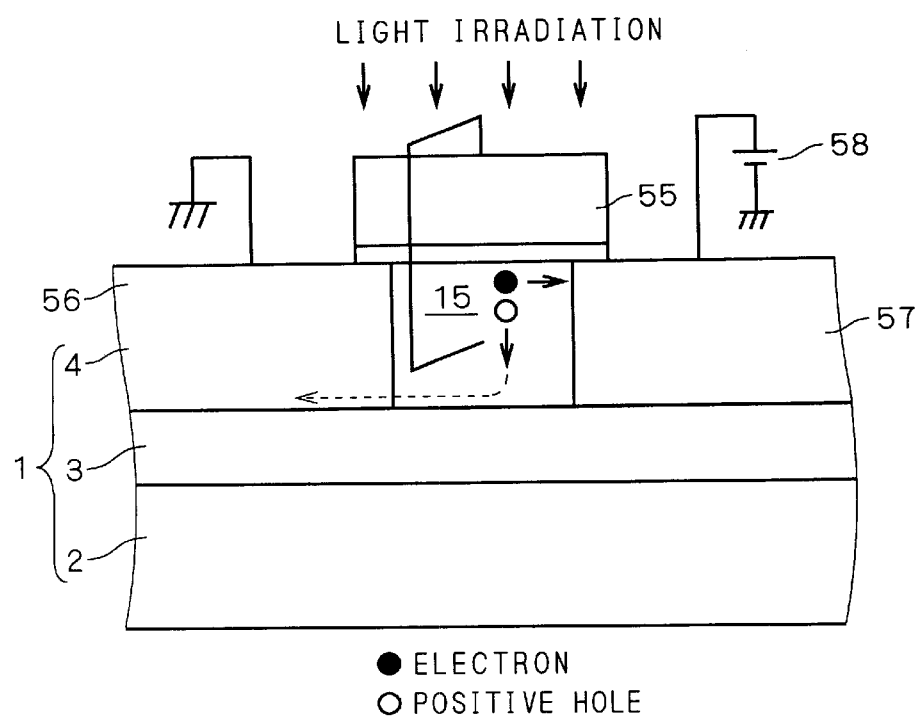
FIG. 45 is a schematic diagram used for explaining an operation of a photosensor shown in FIG. 44.
Figure 48:
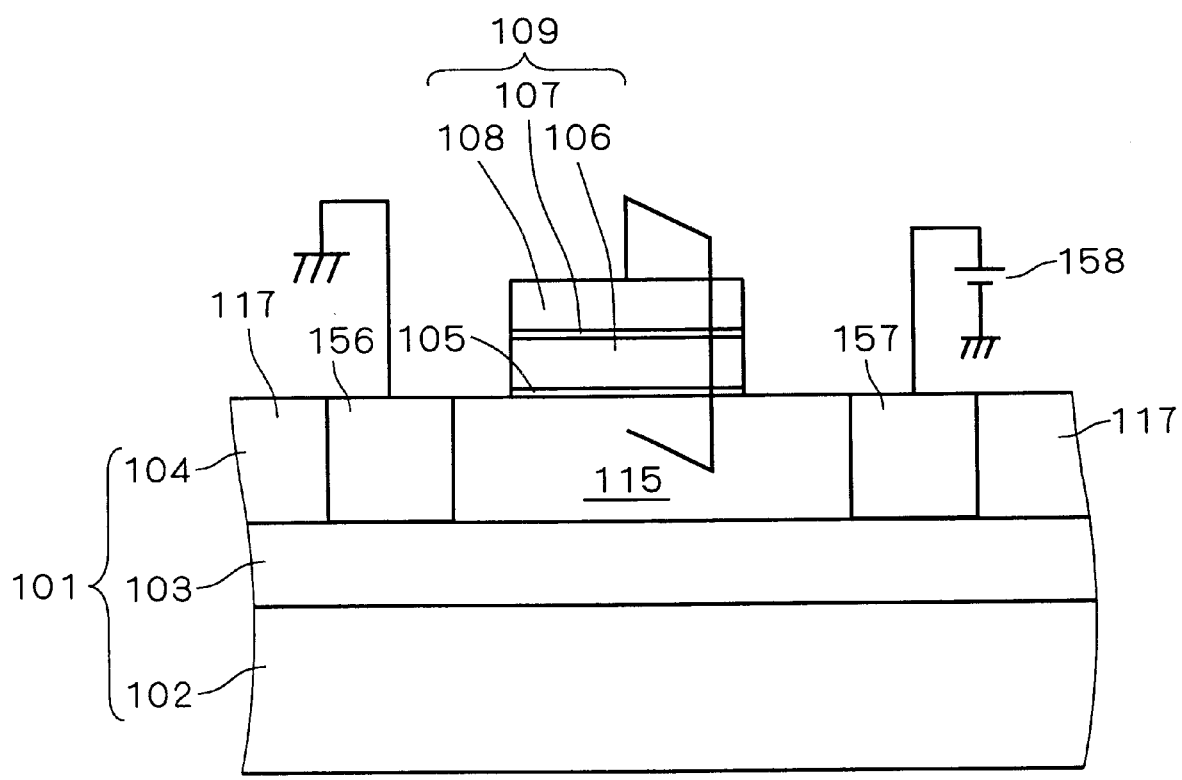
FIG. 48 is a schematic diagram showing a structure of a DTMOSFET in the background art.
Figure 49:
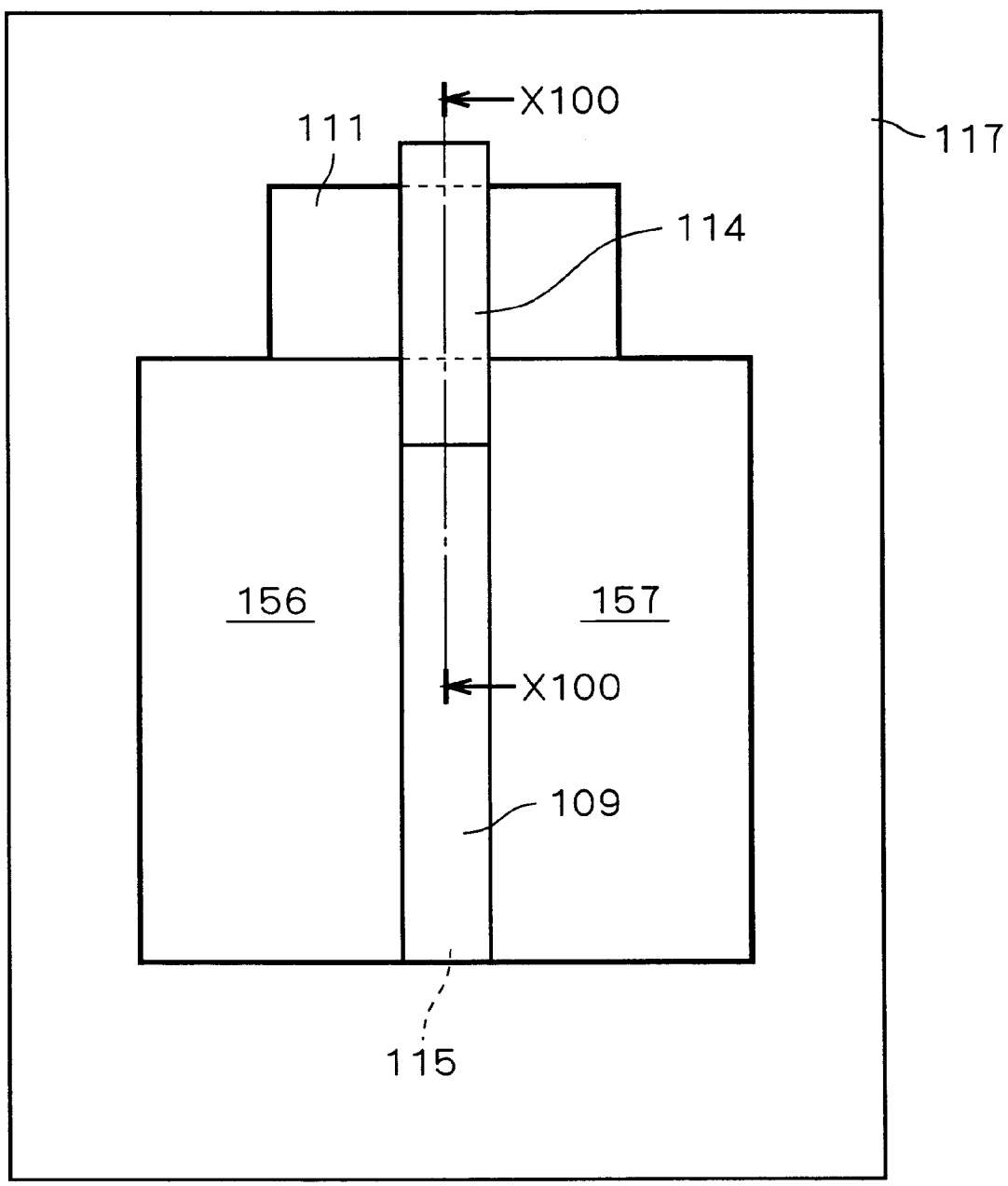
FIG. 49 is a plan view schematically showing the structure of the DTMOSFET in the background art.
Figure 5:
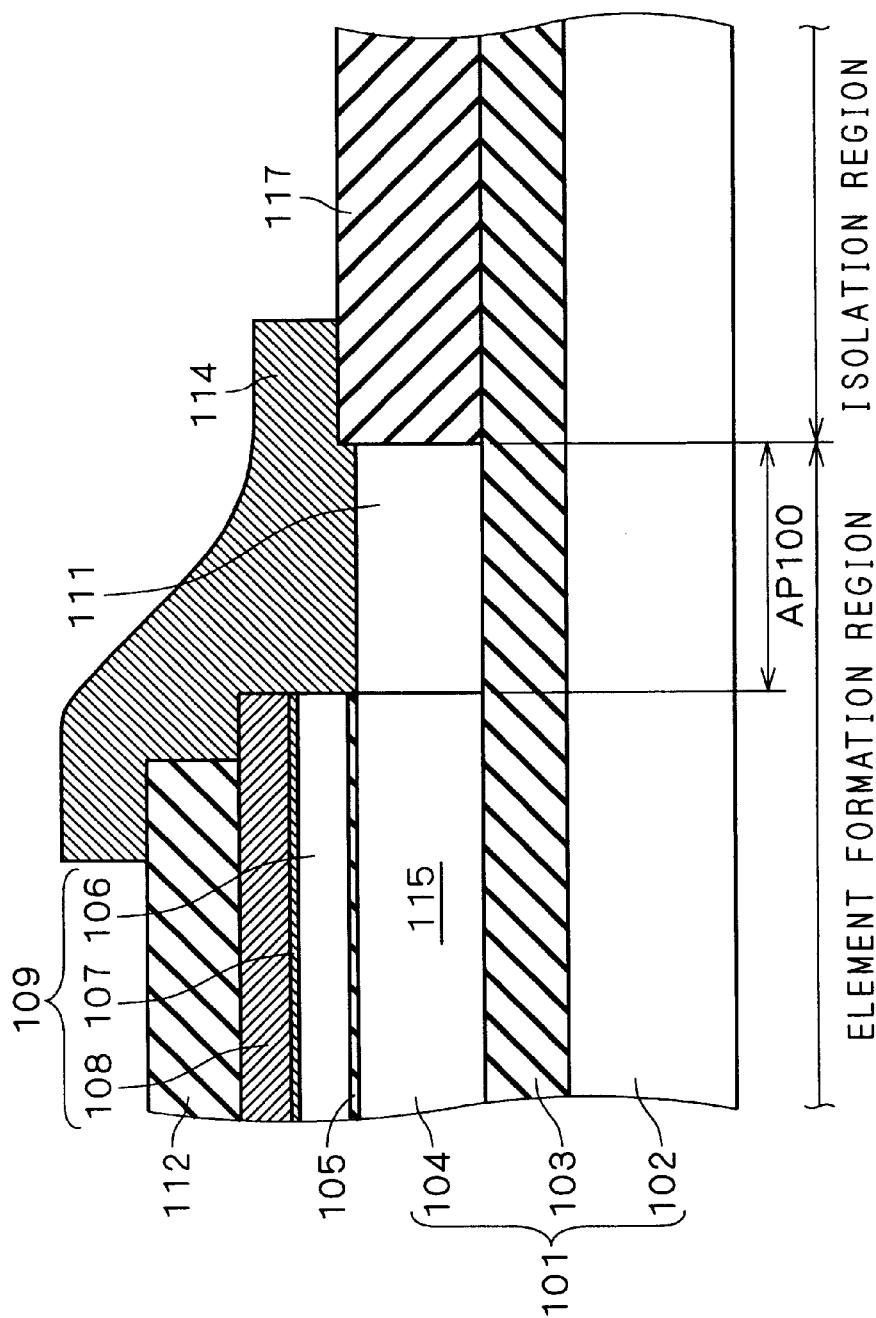

FIG. 45 is a schematic diagram used for explaining an operation of a photosensor shown in FIG. 44. The ground potential is applied to a source region 56 of the DTMOSFET, and a drain region 57 is connected to a power supply 58 such as a battery. When a light irradiated onto the photosensor transmits the gate electrode 55 and reaches the body region 15, a pair of electrons and positive hole are generated in the body region 15 by excitation of light energy. The electrons are drifted to a surface of a silicon layer 56 by an electric field in a vertical direction in a depletion layer and further drawn by a positive potential of the drain region 57 to be drifted into the drain region 57.

On the other hand, since the positive hole is accumulated in the body region 15, the potential of the body region 15 increases and this causes the potential of the gate electrode 55 which is electrically connected to the body region 15 to increase, and therefore the DTMOSFET is driven. As a result, a further current flows between the source and the drain and the positive hole accumulated in the body region 15 is drifted into the source region 56.

FIG. 46 is a graph showing characteristics of a gate-body current $I_{GB}$ related to a gate-body voltage $V_{GB}$. FIG. 46 shows the characteristics at the time when the voltage of 0 V is applied to the source region 56, the drain region 57 and the silicon substrate 1. It can be seen that more gate-body current $I_{GB}$ flows as the intensity of the irradiation light increases. Further, since the voltage of 0 V is applied to the source region 56 and the drain region 57, the gate-body current $I_{GB}$ is not amplified by the transistor.

FIG. 47 is a graph showing characteristics of a photo-electric current $I_P$ and a gain related to the intensity D of the irradiation light. FIG. 47 shows the characteristics at the time when the voltage of 1 V is applied between the source and the drain. It can be seen that more photoelectric current $I_P$ flows as the intensity D of the irradiation light increases. The gain is obtained by dividing the value of the drain current at the time when the source-drain voltage is 1 V by half the value of the gate-body current $I_{GB}$ at the time when the source-drain voltage is 0 V. The reason why half the value of the gate-body current $I_{GB}$ is used is that a current flows in both the source and the body or both the drain and body when there is a reverse bias between the source and the body or between the drain and the body.

Thus, in the semiconductor device of the seventh preferred embodiment, a connection structure of the first preferred embodiment is used for the connection structure between the gate electrode 55 and the body region 15 in the photosensor using the DTMOSFET. Specifically, the gate electrode 55 and the body region 15 are connected to each other with the barrier film 13, the tungsten plug 14 and the impurity diffusion region 11 interposed therebetween and the impurity diffusion region 11 is formed in the isolation region of the SOI substrate 1. Therefore, since it is possible to completely avoid generation of the area penalty (AP100 of FIG. 50), which is generated when the impurity diffusion region 11 is formed in the element formation region, the photosensor can be reduced in size.

Further, though a gate electrode of polymetal structure is taken as an example in the first to seventh preferred embodiments, the present invention may be naturally applied to a gate electrode of other structure such as metal gate structure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an SOI substrate of multilayered structure in which a semiconductor substrate, an insulating layer and a semiconductor layer are layered in this order;
   an isolation insulating film formed in said semiconductor layer in an isolation region of said SOI substrate;
   a body region selectively formed in said semiconductor layer in an element formation region of said SOI substrate defined by said isolation insulating film;
   a gate electrode formed on said body region with a gate insulating film interposed therebetween;
   an interlayer insulating film covering said isolation insulating film and said gate electrode;
   a contact hole so selectively formed in said interlayer insulating film as to expose part of said gate electrode and overlap in plane view part of said isolation insulating film; and
   a connection body including a conductor formed in said contact hole, for electrically connecting said gate electrode and said body region, wherein at least part of a bottom surface of said connection body is in contact with said isolation insulating film.

2. The semiconductor device according to claim 1, wherein
   said conductor is a metal plug.

3. The semiconductor device according to claim 1, wherein
   said conductor is a semiconductor in which an impurity is introduced.

4. The semiconductor device according to claim 1, wherein
   said isolation insulating film is a full-isolation insulating film formed extending from an upper surface of said semiconductor layer to an upper surface of said insulating layer.

5. The semiconductor device according to claim 1, wherein
   said isolation insulating film is a partial-isolation insulating film having a bottom surface which does not reach an upper surface of said insulating layer.

6. The semiconductor device according to claim 1, further comprising:
   a sidewall formed on a side surface of said gate electrode.

7. The semiconductor device according to claim 1, wherein
   the whole of said bottom surface of said connection body overlaps said isolation insulating film below said contact hole.

8. The semiconductor device according to claim 1, wherein
   part of said bottom surface of said connection body overlaps said isolation insulating film below said contact hole.

9. The semiconductor device according to claim 8, wherein
   said contact hole is formed above an upper surface of said semiconductor layer.

10. The semiconductor device according to claim 9, wherein
    said gate electrode has a first semiconductor layer of a first conductivity type, and
    said connection body has a second semiconductor layer of a second conductivity type which is different from said first conductivity type,
    said semiconductor device further comprising an insulating film formed between said first semiconductor layer and said second semiconductor layer.

11. The semiconductor device according to claim 1, further comprising
    a barrier film formed in an interface between said connection body and said body region.

12. The semiconductor device according to claim 1, wherein
    said gate electrode is a gate electrode having light transmissivity.

13. A semiconductor device comprising:
    an SOI substrate of multilayered structure in which a semiconductor substrate, an insulating layer and a semiconductor layer are layered in this order, having a first element formation region and a second element formation region which are isolated from each other by an isolation region;
    an isolation insulating film formed in said semiconductor layer in said isolation region;
    a first semiconductor element formed in said first element formation region, having a first body region selectively formed in said semiconductor layer and a first gate electrode formed on said first body region with a first gate insulating film interposed therebetween;
    a second semiconductor element formed in said second element formation region, having a second body region selectively formed in said semiconductor layer and a second gate electrode formed on said second body region with a second gate insulating film interposed therebetween;
    an interlayer insulating film covering said isolation insulating film and said first and second gate electrodes;
    a contact hole so selectively formed in said interlayer insulating film as to expose part of said first gate electrode and part of said second gate electrode; and
    a connection body including a conductor formed in said contact hole, for electrically connecting said first and second gate electrodes and said first and second body regions.

14. The semiconductor device according to claim 13, wherein
    at least part of a bottom surface of said connection body overlaps in plane view said isolation insulating film.

15. The semiconductor device according to claim 14, wherein
    the whole of said bottom surface of said connection body overlaps said isolation insulating film.

16. A semiconductor device comprising:
    an SOI substrate of multilayered structure in which a semiconductor substrate, an insulating layer and a semiconductor layer are layered in this order;

an isolation insulating film formed in said semiconductor layer in an isolation region of said SOI substrate;

a body region selectively formed in said semiconductor layer in an element formation region of said SOI substrate defined by said isolation insulating film;

a gate electrode formed on said body region with a gate insulating film interposed therebetween; and bias generation means connected between said body region and said gate electrode, for limiting a body voltage which is to be applied to said body region to 0.6 V or lower.

17. The semiconductor device according to claim 16, further comprising:

an interlayer insulating film covering said isolation insulating film and said gate electrode;

a contact hole so selectively formed in said interlayer insulating film as to expose part of said gate electrode and overlap in plane view part of said isolation insulating film; and a connection body including a conductor formed in said contact hole, being connected to said body region, wherein at least part of a bottom surface of said connection body overlaps in plane view said isolation insulating film below said contact hole.

18. The semiconductor device according to claim 17, further comprising:

a sidewall made of an insulating film for preventing said gate electrode and said conductor from coming into electrical contact.

* * * * *